US012677687B2

(12) United States Patent
Yabe

(10) Patent No.: US 12,677,687 B2
(45) Date of Patent: Jul. 7, 2026

(54) MULTI-WAFER BONDING FOR NAND SCALING

(71) Applicant: Sandisk Technologies, Inc., Milpitas, CA (US)

(72) Inventor: Hiroki Yabe, Yokohama (JP)

(73) Assignee: Sandisk Technologies, Inc., Milpitas, CA (US)

( * ) Notice: Subject to any disclaimer, the term of this patent is extended or adjusted under 35 U.S.C. 154(b) by 418 days.

(21) Appl. No.: 18/358,644

(22) Filed: Jul. 25, 2023

(65) Prior Publication Data

US 2024/0250007 A1    Jul. 25, 2024

Related U.S. Application Data

(60) Provisional application No. 63/481,329, filed on Jan. 24, 2023.

(51) Int. Cl.
| | |
|---|---|
| *H10W 70/685* | (2026.01) |
| *G11C 7/18* | (2006.01) |
| *G11C 16/28* | (2006.01) |
| *H10B 43/35* | (2023.01) |
| *H10W 72/00* | (2026.01) |

(Continued)

(52) U.S. Cl.
CPC ............. *H10W 70/685* (2026.01); *G11C 7/18* (2013.01); *G11C 16/28* (2013.01); *H10B 43/35* (2023.02); *H10W 90/00* (2026.01); *H10W 90/701* (2026.01); *H10W 72/07253* (2026.01); *H10W 72/232* (2026.01); *H10W 72/932* (2026.01); *H10W 74/10* (2026.01); *H10W 80/732* (2026.01); *H10W 90/297* (2026.01);

(Continued)

(58) Field of Classification Search
CPC . H10W 70/685; H10W 90/00; H10W 90/701; H10W 72/07253; H10W 72/232; H10W 72/932; H10W 74/10; H10W 80/732; H10W 90/297; H10W 90/722; H10W 90/732; H10W 90/792; H10W 72/20; H10W 72/30; H10W 72/90; G11C 7/18; G11C 16/28; G11C 16/0483; H10B 43/35; H10B 43/27
See application file for complete search history.

(56) References Cited

U.S. PATENT DOCUMENTS

| | | |
|---|---|---|
| 10,283,493 B1 | 5/2019 | Nishida |
| 10,510,738 B2 | 12/2019 | Kim et al. |

(Continued)

*Primary Examiner* — Allison Bernstein
(74) *Attorney, Agent, or Firm* — Pearl Cohen Zedek Latzer Baratz LLP

(57) ABSTRACT

Technology is disclosed herein for a memory device with multiple dies bonded together. The memory device may be referred to herein as an integrated memory assembly. The integrated memory assembly has a control semiconductor die and two or more memory semiconductor dies. In one embodiment, each memory semiconductor die has a memory structure having blocks of memory cells. Bit lines extend over the respective memory structure. In one embodiment the integrated memory assembly has what is referred to herein as a "separate bit line architecture". The separate bit line architecture allows the control semiconductor die to control a memory operation in parallel in the two memory semiconductor dies. Moreover, the separate bit line architecture allows for good scaling of a memory device with multiple dies bonded together.

15 Claims, 20 Drawing Sheets

(51) Int. Cl.

| | |
|---|---|
| *H10W 72/20* | (2026.01) |
| *H10W 72/90* | (2026.01) |
| *H10W 74/10* | (2026.01) |
| *H10W 80/00* | (2026.01) |
| *H10W 90/00* | (2026.01) |
| *H10W 90/20* | (2026.01) |

(52) U.S. Cl.
    CPC ........ *H10W 90/722* (2026.01); *H10W 90/732* (2026.01); *H10W 90/792* (2026.01)

(56) References Cited

U.S. PATENT DOCUMENTS

| | | | |
|---|---|---|---|
| 10,879,260 B2 * | 12/2020 | Uryu | G11C 16/08 |
| 11,024,385 B2 | 6/2021 | Chibvongodze et al. | |
| 11,037,908 B2 | 6/2021 | Wu et al. | |
| 11,256,591 B2 * | 2/2022 | Alrod | G06F 11/3062 |
| 11,322,483 B1 | 5/2022 | Ogawa et al. | |

\* cited by examiner

Figure 9A    <u>207</u>
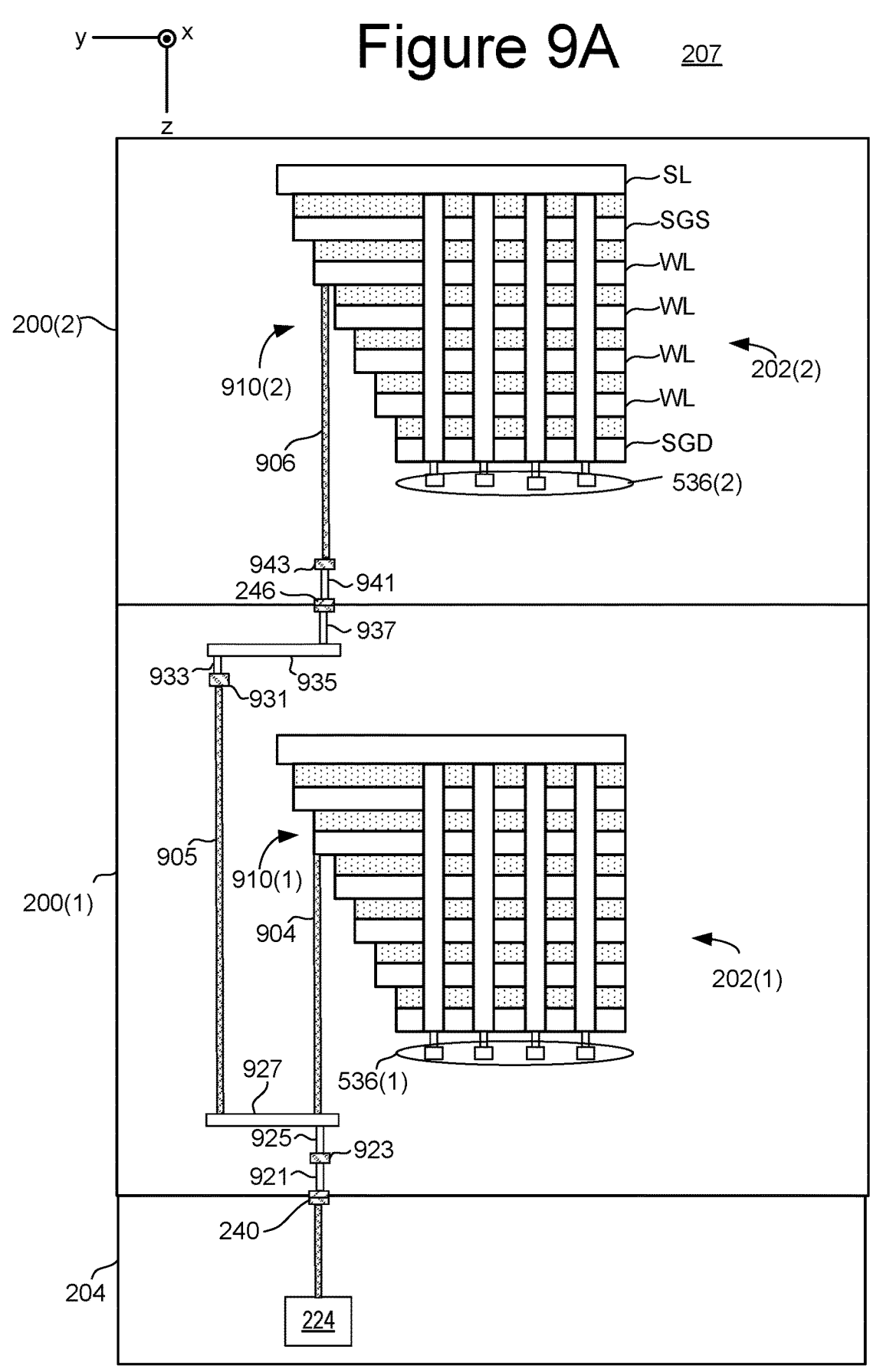

207

MULTI-WAFER BONDING FOR NAND SCALING

CLAIM OF PRIORITY

The present application claims priority from U.S. Provisional Patent Application No. 63/481,329, entitled "MULTI-WAFER BONDING FOR NAND SCALING," by Yabe, filed Jan. 24, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional (3D). One type of 3D memory structure has non-volatile memory cells arranged as vertical NAND strings (where "vertical" is defined with respect to a substrate on which the 3D memory structure is formed). The memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

The memory system typically has column control circuitry to operate the bit lines and row control circuitry to operate the word lines. The column control circuitry may include bit line voltage drivers, column decoders, and read/write circuits. The row control circuitry may include word line voltage drivers and row decoders. The memory system typically has additional circuitry to perform function such as generating voltages and controlling the memory operations at the die level. The die level control includes controlling the voltages applied to the bit lines, word lines, and other control lines, as well as controlling the sense amplifiers. The control circuitry will typically occupy a substantial amount of space on a semiconductor die.

There are electrical connections between the column control circuitry and the bit lines, as well as electrical connections between the row control circuitry and the rows (e.g., word lines and select lines).

BRIEF DESCRIPTION OF THE DRAWINGS

Like-numbered elements refer to common components in the different figures.

FIG. 9A depicts an integrated memory assembly having a shorted word architecture.

DETAILED DESCRIPTION

Technology is disclosed herein for a memory device with multiple dies bonded together. The memory device may be referred to herein as an integrated memory assembly. The integrated memory assembly has a control semiconductor die and two or more memory semiconductor dies. In one embodiment, each memory semiconductor die has a memory structure having blocks of memory cells. Bit lines extend over the respective memory structure. In one embodiment the integrated memory assembly has what is referred to herein as a "separate bit line architecture". The separate bit line architecture allows the control semiconductor die to control a memory operation in parallel in the two memory semiconductor dies. Moreover, the separate bit line architecture allows for good scaling of a memory device with multiple dies bonded together.

Figure 1A:
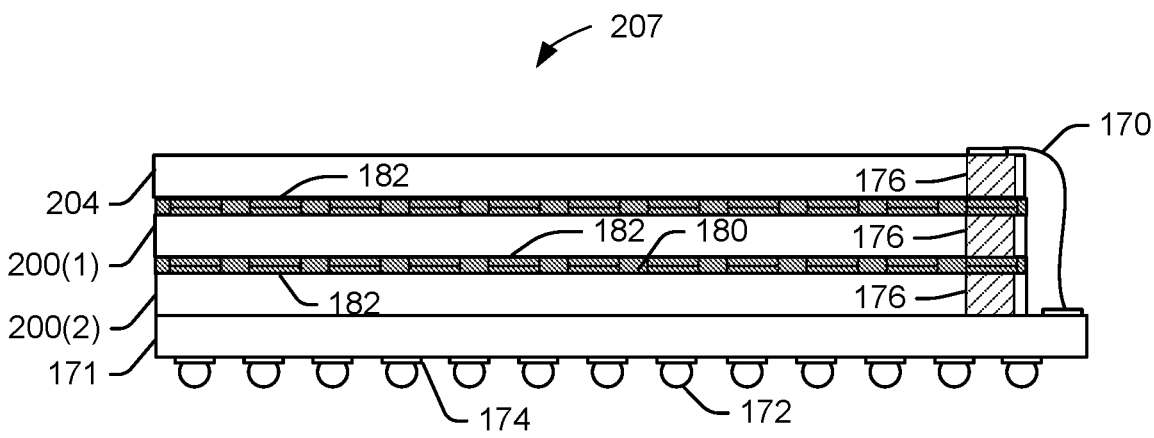
FIG. 1A depicts a side view of an example of an integrated memory assembly stacked on a substrate.

FIG. 1A depicts a side view of an example of an integrated memory assembly 207 stacked on a substrate 171. In an embodiment, the integrated memory assembly 207 may be referred to as a non-volatile memory device. The integrated memory assembly 207 has a control semiconductor die 204 and two memory semiconductor dies 200(1), 200(2). Each semiconductor die 200, 204 could also be referred to as a wafer. For brevity, a semiconductor die may be referred to herein as a "die." The integrated memory assembly 207 uses wafer-to-wafer bonding to provide a bonded memory die pair, along with a control die bonded to the memory die pair. In some embodiments, there are more than two memory dies 200. There may also be more than one control die 204. Each memory die 200 contains memory cells. In one embodiment, each memory die 200 contains NAND memory cells. The control die 204 controls memory operations at a die level in the memory dies 200.

The control die 204 is affixed (e.g., bonded) to memory die 200(1). Memory die 200(2) is affixed (e.g., bonded) to memory die 200(1). Some of the bond pads 182 are depicted. Each bond pad 182 may include a bond pad pair, with one bond pad on each adjacent die. There may be many more bond pads. A space between adjacent dies that are bonded together may be filled with a solid layer 180, which may be formed from epoxy or other resin or polymer. This solid layer 180 protects the electrical connections between the dies, and further secures the dies together. Various materials may be used as solid layer 180.

The integrated memory assembly 207 may for example be stacked with a stepped offset, leaving some bond pads on top of the control die 204 uncovered and accessible from above. Wire bonds 170 connected to those top bond pads connect the control die 204 to the substrate 171. A number of such wire bonds may be formed across the width of the control die 204 (i.e., into the page of FIG. 1A). Note that another group of a control die 204 and two memory dies 200 may be stacked on top of the dies depicted in FIG. 1A (offset to allow wire bonds 170 to access the bond pads of the control die 204)

Through silicon vias (TSV) 176 may be used to route signals through a die 200, 204. The TSVs 176 may be formed before, during or after formation of the integrated circuits in the semiconductor dies 200, 204. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 172 may optionally be affixed to contact pads 174 on a lower surface of substrate 171. The solder balls 172 may be used to couple the integrated memory assembly 207 electrically and mechanically to a host device such as a printed circuit board. Solder balls 172 may be omitted where the integrated memory assembly 207 is to be used as an LGA package. The solder balls 172 may form a part of the interface between integrated memory assembly 207 and a memory controller.

Figure 1B:
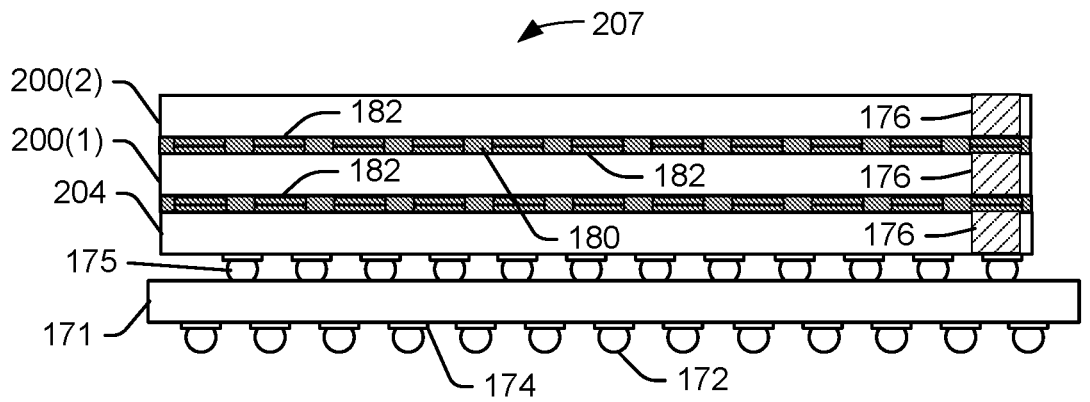
FIG. 1B depicts a side view of another example of an integrated memory assembly stacked on a substrate.

FIG. 1B depicts a side view of another example of an integrated memory assembly 207 stacked on a substrate 171. The control die 204 is affixed to the substrate 171 in the example of FIG. 1B. The control die 204 is affixed to the substrate 171 by pads 175. Therefore, wire bonds 170 (see FIG. 1A) are not necessary. Some of the bond pads 182 are depicted. There may be many more bond pads. A space between two adjacent dies that are bonded together may be filled with a solid layer 180, which may be formed from epoxy or other resin or polymer. Through silicon vias (TSV) 176 may be used to route signals through dies 200, 204. Solder balls 172 may optionally be affixed to contact pads 174 on a lower surface of substrate 171. The solder balls 172 may be used to couple the integrated memory assembly 207 electrically and mechanically to a host device such as a printed circuit board. Solder balls 172 may be omitted where the integrated memory assembly 207 is to be used as an LGA package.

As has been briefly discussed above, the control die 204 and the memory dies 200 may be bonded together. Bond pads on each die 200, 204 may be used to bond adjacent dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 200, 204. Where no such film is initially provided, a space between the die may be under filled with an epoxy or other resin or polymer. The under-fill material may be applied as a liquid which then hardens into a solid layer. This under-fill step protects the electrical connections between the dies 200, 204, and further secures the die together. Various materials may be used as under-fill material.

Figure 2:
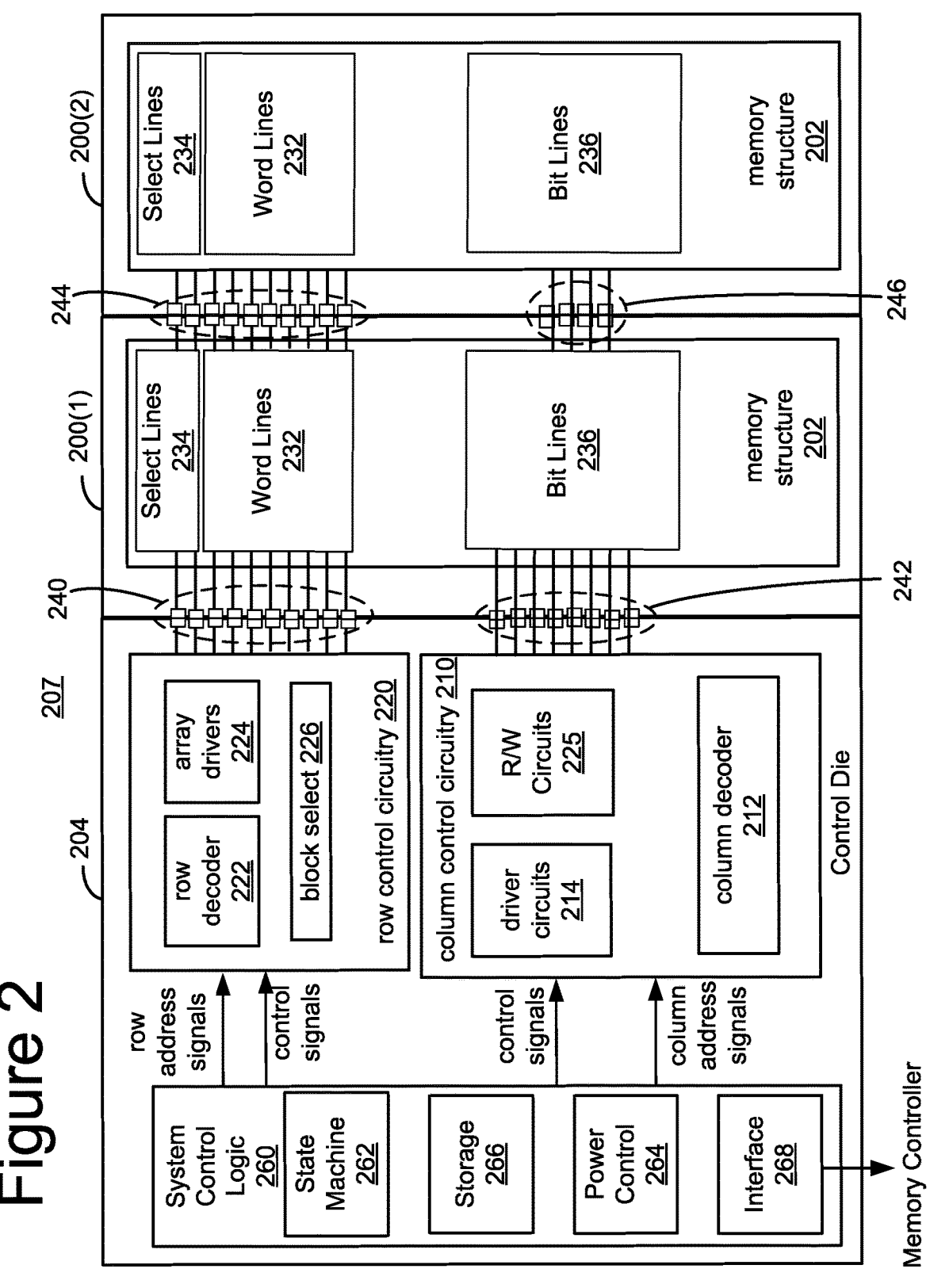
FIG. 2 is a block diagram of one embodiment of an integrated memory assembly.

FIG. 2 depicts one embodiment of an integrated memory assembly 207. The integrated memory assembly 207 uses wafer-to-wafer bonding to provide a bonded memory die pair, along with a control die bonded to the memory die pair. The integrated memory assembly 207 includes two types of semiconductor dies (or more succinctly, "die"). Control die 204 includes control circuitry 260, 210, and 220. The control die 204 may also be referred to as a "logic die" or a "CMOS die". There are two memory dies 200(1), 200(2). The control die 204 and first memory die 200(1) are bonded together. In an embodiment, first word line bond pad pairs 240 and first bit line bond pad pairs 242 are used to bond the control die 204 and first memory die 200(1) together. The first memory die 200(1) and the second memory die 200(2) are bonded together. An embodiment, second word line bond pad pairs 244 and second bit line bond pad pairs 246 are used to bond the first memory die 200(1) and the second memory die 200(2) together. Each memory die 200 includes a memory structure 202 (e.g., memory array) that can comprise non-volatile memory cells (also referred to as non-volatile storage cells), as described in more detail below.

The components depicted in FIG. 2 are electrical circuits. Each memory structure 202 includes the word lines 232 and select lines 234, which may be organized as rows. Each memory structure has bit lines 236, which may be organized as columns. The bit lines 236 may be considered to be part of the memory structure or may be referred to as extending over the memory structure. In one embodiment, the bit lines 236 in memory die 200(1) include data bit lines alternating with dummy bit lines. A data bit line connects to NAND strings on that memory die. Therefore, a data bit line may be used when reading or writing memory cells on that memory die 200. A dummy bit line does not connect to any NAND strings on that memory die. In an embodiment, dummy bit lines on memory die 200(1) connect to data bit lines on memory die 200(2).

Control die 204 includes row control circuitry 220, whose outputs are connected to respective word lines 234 and select lines 234 of the memory structure 202. In one embodiment the electrical pathway between the row control circuitry 220 and word lines 232 (and select lines 234) includes first word line bond pad pairs 240. In one embodiment, word lines 232 in memory die 200(1) are electrically connected to corresponding word lines 232 in memory die 200(2). In one embodiment the electrical pathway between the word lines 232 in memory die 200(1) and the word lines in memory die 200(2) includes second word line bond pad pairs 244. Row control circuitry 220 receives a group of M row address signals and one or more various control signals from System Control Logic circuit 260, and typically may include such circuits as row decoders 222, array drivers 224, and block select circuitry 226 for both reading and writing (programming) operations.

Memory die 200 also includes column control circuitry 210 including read/write circuits 225. The column control circuitry 210 may also be referred to as bit line control circuitry. The read/write circuits 225 may contain sense amplifiers and data latches. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers. In one embodiment the electrical pathways between the column control circuitry 210 and the bit lines 236 in memory die 200(1) includes first bit line bond pad pairs 242. In one embodiment at least some of the bit lines 236 in the first memory die 200(1) are electrically connected to the bit lines 236 in the second memory die 200(2). In an embodiment, the electrical pathways between the bit lines 236 in memory die 200(1) and the bit lines 236 in memory dies 200(2) include second bit line bond pad pairs 246. Although only a single block is shown for structure 202, a memory die can include multiple arrays that can be individually accessed.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller and control die 204 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

For purposes of this document, the phrases "a control circuit" or "one or more control circuits" can include any one of or any combination of state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3:
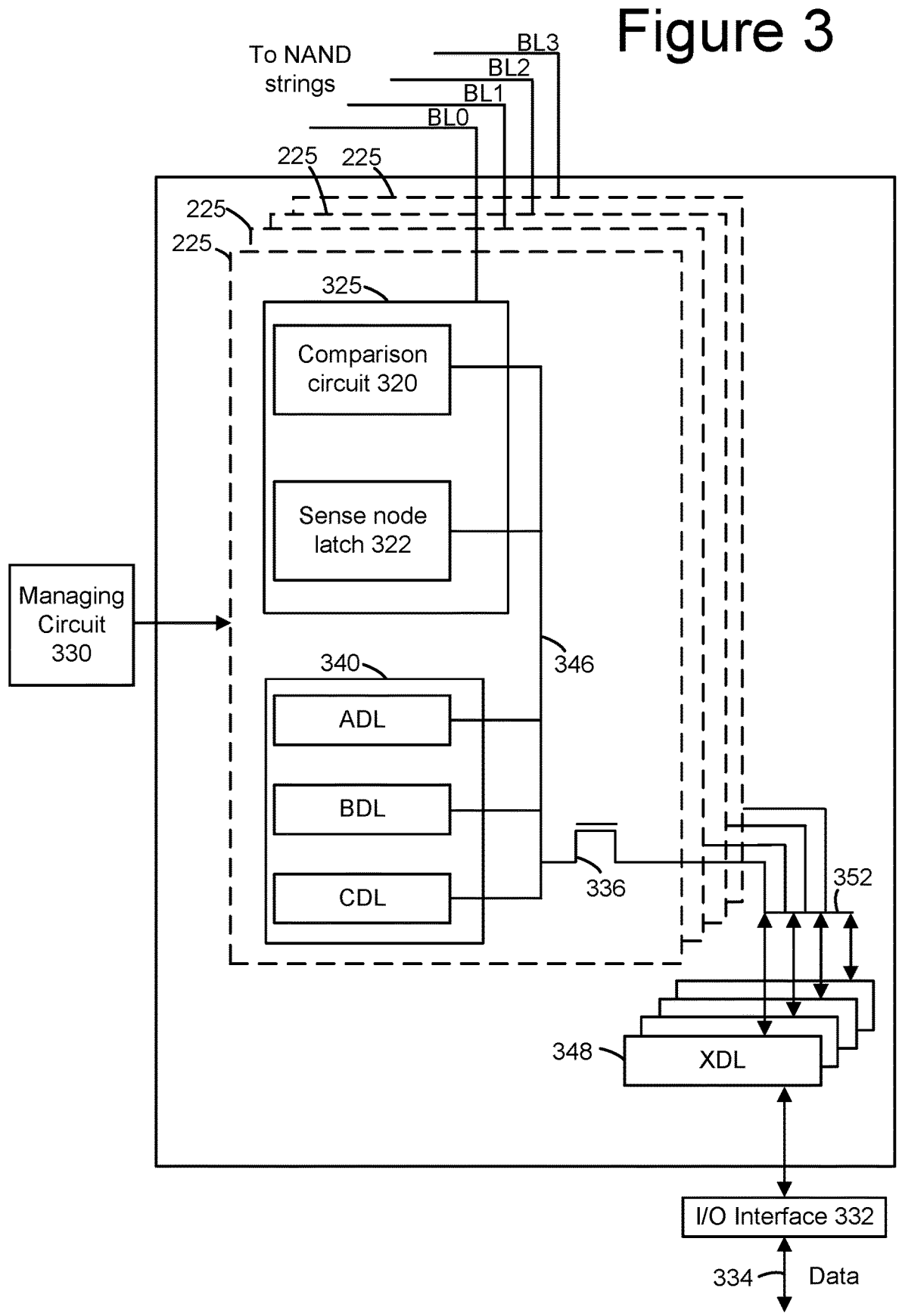
FIG. 3 is a block diagram depicting one embodiment of a portion of column control circuitry that contains a number of read/write circuits.

FIG. 3 is a block diagram depicting one example of a portion of column control circuitry 210 that contains a number of read/write circuits 225. Each read/write circuit 225 is partitioned into a plurality of sense amplifiers 325 and data latches 340. A managing circuit 330 controls the read/write circuits 225. The managing circuit 330 may communicate with state machine 262. In one embodiment, each sense amplifier 325 is connected to a respective bit line. Each bit line may be connectable, at one point in time, to one of a large number of different NAND strings. A select gate on the NAND string may be used to connect the NAND string channel of one of the NAND strings to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the reference voltage. If the sense node voltage does not decay below Vtrip, the memory cell is in a non-conductive state and its Vth is above the reference voltage. A sense node latch 322 is set to 0 or 1, for example, by the comparison circuit 320 based on whether the memory cell is in a conductive or non-conductive state, respectively.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340. The sense amplifier 325 is able to control the magnitude of the voltage on the bit line during sensing.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells has been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. However, in some embodiments, verify is not performed. If verify is not performed, memory cells may still be locked out after a pre-determined number of pulse have been applied to the cell given the target data state.

Figure 4A:
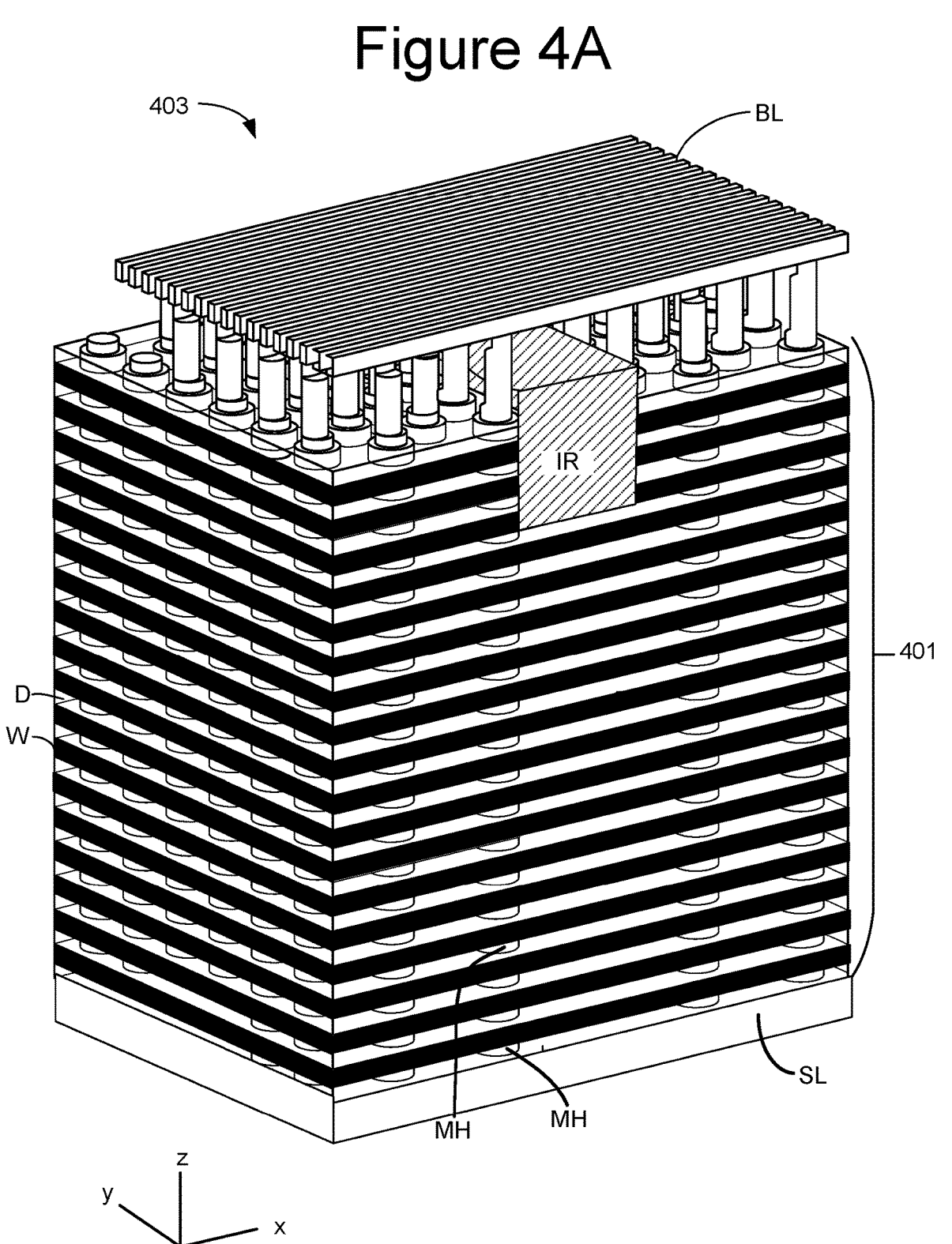
FIG. 4A is a perspective view of a portion of one example embodiment of a monolithic three-dimensional memory structure.

FIG. 4A is a perspective view of a portion of one example embodiment of a monolithic three dimensional memory array/structure that can comprise memory structure 202, which includes a plurality non-volatile memory cells arranged as vertical NAND strings. For example, FIG. 4A shows a portion 403 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4A shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4B:
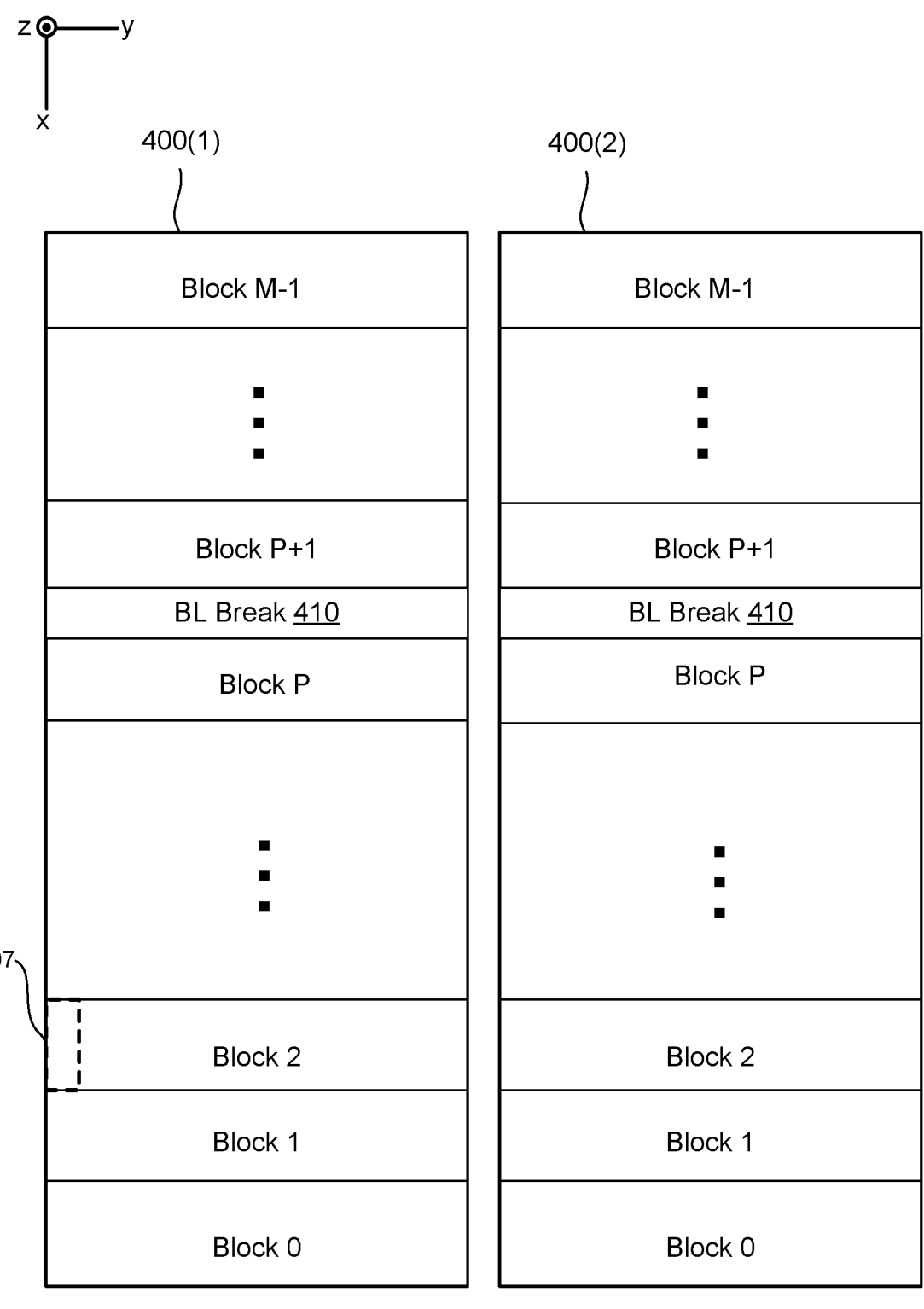
FIG. 4B is a block diagram of one example organization of a memory structure having two planes.

FIG. 4B is a block diagram explaining one example organization of memory structure 202, which is divided into two planes 400(0), 400(1). Each plane 400 is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4B shows two planes 400, more or fewer than two planes can be implemented.

Each plane 400 also has a bit line (BL) break region 410. A BL break region 410 is a region that does not contain a block of memory cells. The BL break region 410 may contain vias or other structures. In some embodiments, the vias in the BL break region are used to connect bit lines in one memory die 200 to bit lines in another memory die 200.

FIG. 4B shows a BL break region 410 between Block P and Block P+1; however, there may be more than one BL break region 410 in each plane 400.

Figure 5A:
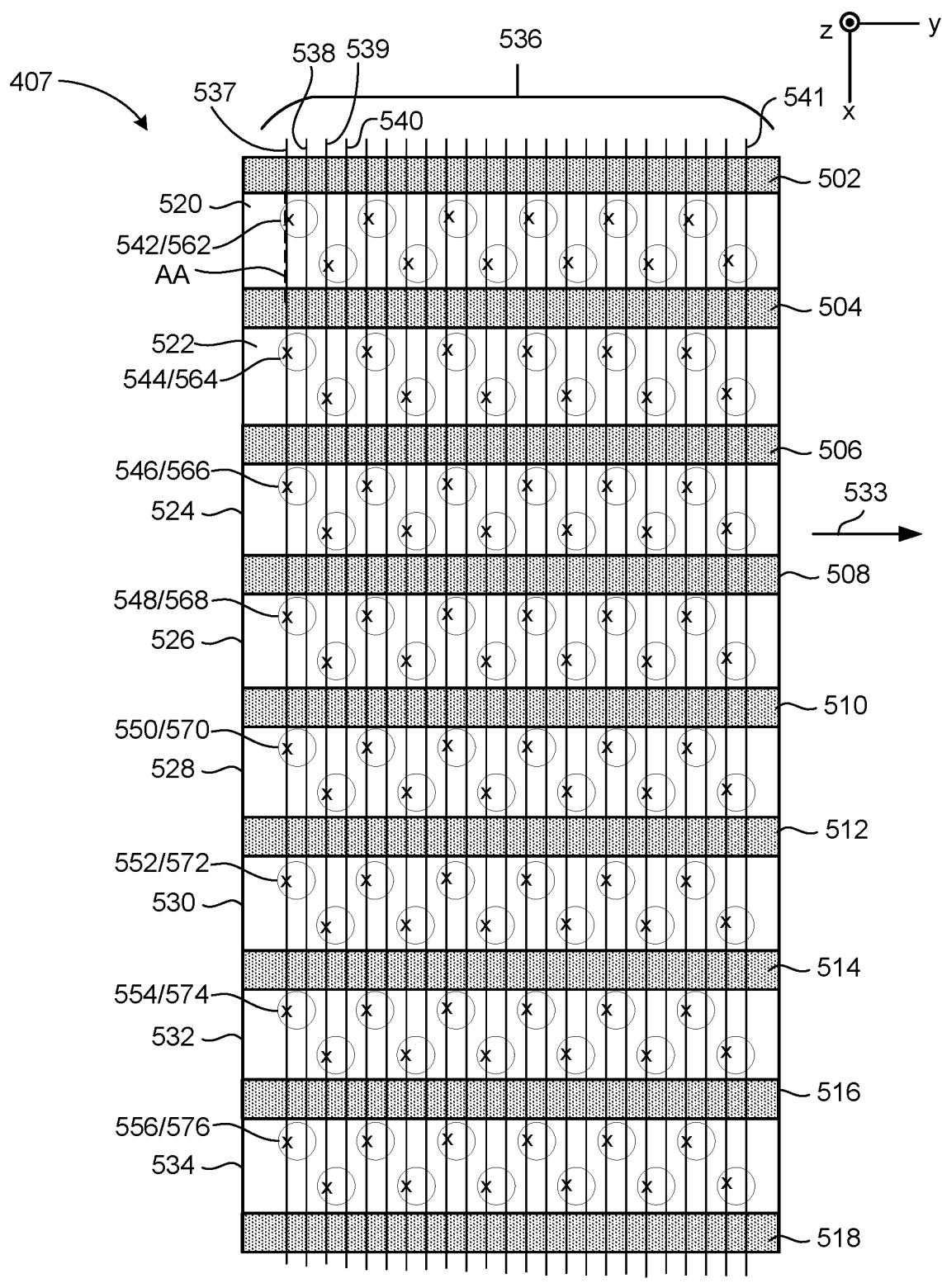
FIG. 5A is a block diagram depicting a top view of one embodiment of a portion 407 of Block 2 of plane 400(0) in FIG. 4B in which there are data bit lines and dummy bit lines.

FIG. 5A is a block diagram depicting a top view of one embodiment of a portion 407 of Block 2 of plane 400(0). As can be seen from FIG. 5A, the block depicted in FIG. 5A extends in the direction of arrow 533. In one embodiment, the memory array has many layers; however, FIG. 5A only shows the top layer.

FIG. 5A depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 5A depicts vertical columns 542, 544, 546, 548, 550, 552, 554, and 556. Vertical column 542 implements NAND string 562. Vertical column 544 implements NAND string 564. Vertical column 546 implements NAND string 566. Vertical column 548 implements NAND string 568. Vertical column 550 implements NAND string 570. Vertical column 552 implements NAND string 572. Vertical column 554 implements NAND string 574. Vertical column 556 implements NAND string 576. More details of the vertical columns are provided below. Since the block depicted in FIG. 5A extends in the direction of arrow 533, the block includes more vertical columns than depicted in FIG. 5A.

FIG. 5A also depicts a set of bit lines 536, including bit lines 537, 538, 539, 540 . . . 541. FIG. 5A shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 537 is connected to vertical columns 542, 544, 546, 548, 550, 552, 554, and 556. Note that FIG. 5A depicts 24 bit lines, but only 12 NAND strings per sub-block. Thus, there are twice as many bit lines as NAND strings per sub-block.

Some of the bit lines 536 in FIG. 5A are data bit line and other bit lines are dummy bit lines. A data bit line connects to vertical columns/NAND strings in the block. A dummy bit line does not connect to any vertical column/NAND string in the block. Furthermore, dummy bit line does not connect to any vertical column/NAND string in the memory die having the dummy bit line. Bit lines 537 and 539 are examples of data bit lines. Bit lines 538 and 540 are examples of dummy bit lines. Note that the data bit lines alternate with the dummy bit lines. By "alternate" it is meant that other than a bit line at an edge, a data bit line has a dummy bit line on both sides. Likewise, a dummy bit line has a data bit line on both sides. In an embodiment, the dummy bit lines in one memory die (e.g., memory die 200(1) are electrically connected to the data bit lines in another memory die (e.g., memory die 200(2)). In one embodiment, the data bit lines in a memory die 200 do not connect to the data bit lines in any other memory die 200. However, in one embodiment, the data bit lines in a memory die 200 may connect to the data bit lines in another memory die 200.

The block depicted in FIG. 5A includes a set of isolation regions 502, 504, 506, 508, 510, 512, 514, 516, and 518, which are formed of $SiO_2$; however, other dielectric materials can also be used. Isolation regions 502, 504, 506, 508, 510, 512, 514, 516, and 518 serve to divide the top layers of the block into eight regions; for example, the top layer depicted in FIG. 5A is divided into regions 520, 522, 524, 526, 528, 530, 532, and 534, each of which serves as a drain side select line (SGD). Each SGD may be used to select the NAND strings in that region. Thus, each SGD may be used to select a different group of the NAND strings in the block. The portion of the block that is selected by one SGD may be referred to as a sub-block. Therefore, regions 520, 522, 524, 526, 528, 530, 532, and 534 correspond to sub-block. In one embodiment, isolation regions 502 and 518 separate the block from adjacent blocks. Thus, isolation regions 502 and 518 may extend down to the substrate. In one embodiment, the isolation 504, 506, 508, 510, 512, 514, 516 only divide the layers used to implement select gates so that NAND strings in different sub-blocks can be independently selected. In one embodiment, a data bit line only connects to one vertical column/NAND string in each of regions (sub-blocks) 520, 522, 524, 526, 528, 530, 532, and 534. In that embodiment, each block has 16 rows of active columns and each bit line connects to eight vertical columns/NAND strings in each block. In one embodiment, all of the eight vertical columns/NAND strings connected to a common bit line are connected to the same word line (or set of word lines); therefore, the system uses the drain side selection lines to choose one (or another subset) of the eight to be subjected to a memory operation (program, verify, read, and/or erase).

Although FIG. 5A shows each region (or sub-block) having two rows of vertical columns, eight regions and 16 rows of vertical columns in a block, those exact numbers are an example implementation. Other embodiments may include more or fewer regions per block, more or fewer rows of vertical columns per region and more or fewer rows of vertical columns per block. FIG. 5A also shows the vertical columns being staggered. In other embodiments, different patterns of staggering can be used. In some embodiments, the vertical columns are not staggered.

Figure 5B:
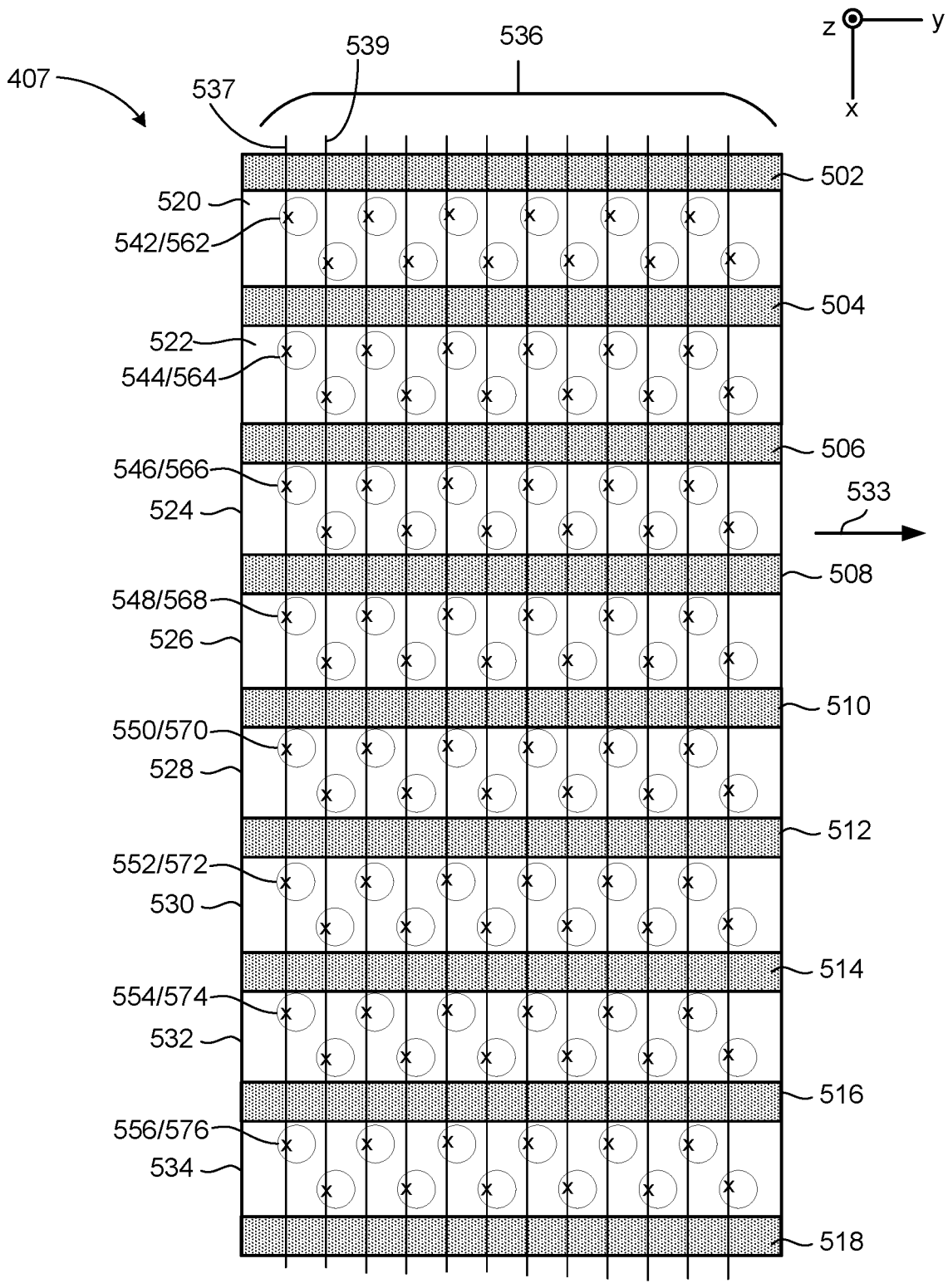
FIG. 5B is a block diagram depicting a top view of one embodiment of a portion 407 of Block 2 of plane 400(0) in which there are data bit lines but no dummy bit lines.

In one embodiment, at least one of the memory dies 200 has data bit lines but no dummy bit lines. FIG. 5B is a block diagram depicting a top view of one embodiment of a portion 407 of Block 2 of plane 400(0) in which there are data bit lines but no dummy bit lines. The embodiment of depicted in FIG. 5B is similar to an embodiment of FIG. 5A; however, the dummy bit lines are omitted. Thus there are half as many bit lines in the architecture depicted in FIG. 5B relative to the architecture depicted in FIG. 5A. However, each sub-block in the architecture depicted in FIG. 5B has the same number of NAND strings as the architecture depicted in FIG. 5A.

In one embodiment, the bit line architecture of FIG. 5A is used for the memory die 200(1) that is bonded to the control die 204, whereas the bit line architecture of FIG. 5B is used for the memory die 200(2) that is bonded to memory die 200(1) but not bonded to the control die 204. As noted previously, the dummy bit lines of memory die 200(1) may be electrically connected to the data bit lines in memory die 200(2). By not having dummy bit lines in memory die 200(2) capacitive coupling between the bit lines in memory die 200(2) may be reduced. However, the dummy but lines may also be present in memory die 200(2), which allows a more uniform fabrication process when fabricating memory die 200(1) and memory die 200(2).

Figure 5C:
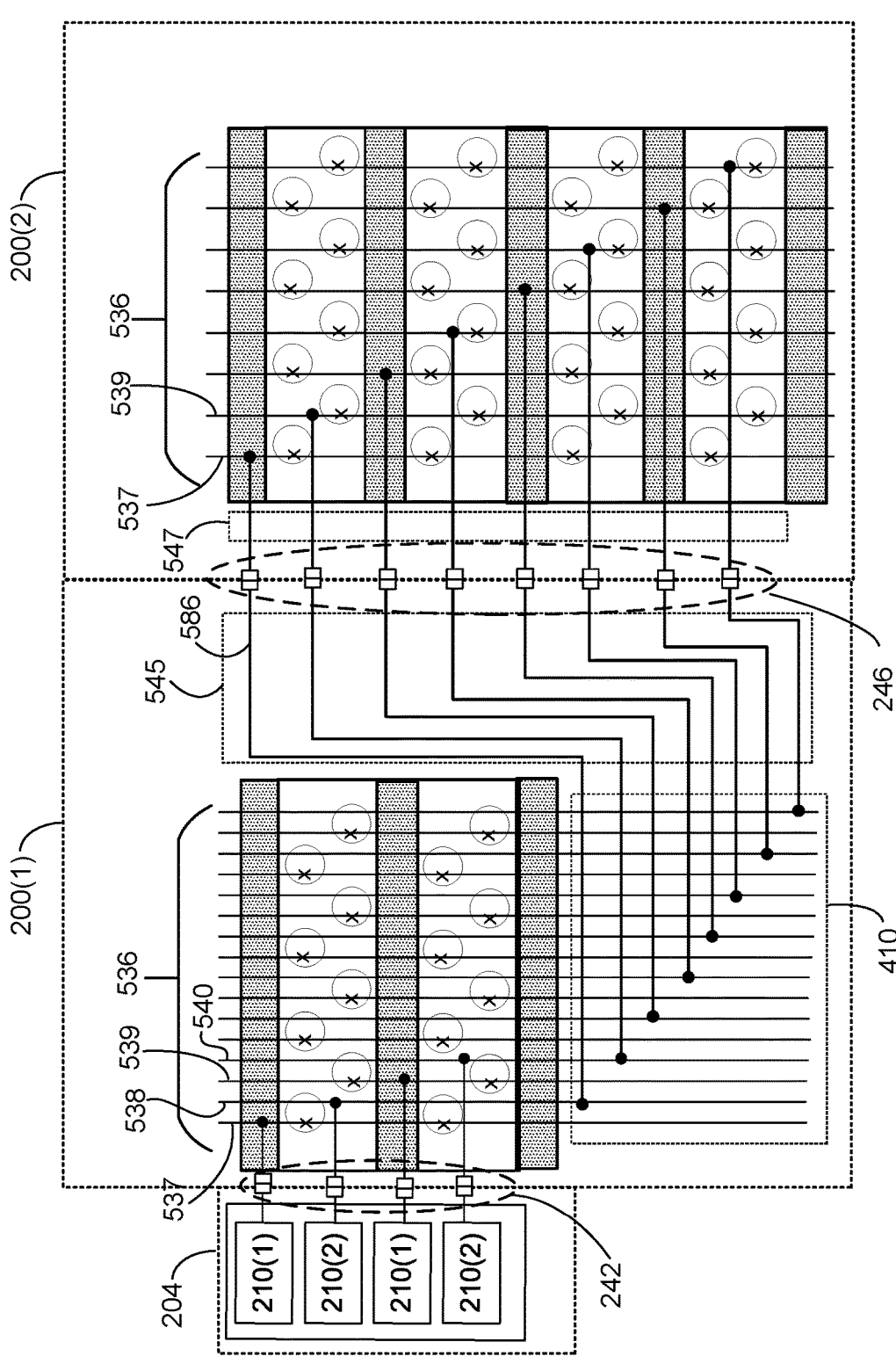
FIG. 5C is diagram depicting one embodiment of electrical connections between column control circuitry on the control die and bit lines in memory dies.

FIG. 5C is diagram depicting one embodiment of electrical connections between column control circuitry 210 on the control die 204 and bit lines in memory dies 200. Memory die 200(1) has data bit lines and dummy bit lines. Memory die 200(2) has data bit lines, but not dummy bit lines. The dummy bit lines of memory die 200(1) are electrically connected to the data bit lines of memory die 200(2). For example, electrical pathway 586 connects dummy bit line 538 on first memory die 200(1) to data bit line 527 on second memory die 200(2). Similar electrical pathways connect other dummy bit lines on first memory die 200(1) to other data bit lines 527 on second memory die 200(2). The second bit line bond pad pairs 246 are depicted, showing that each electrical pathway includes one of the second bit line bond pad pairs 246. The electrical pathways may be routed through the bit line break region 410 the first memory die 200(1). The electrical pathways may be routed through one or more metal layers (as well as vias) in a die. Region 545 in first memory die 200(1) includes one or more metal layers. Region 547 in second memory die 200(2) may have one or more metal layers (and vias) through which the electrical pathways are routed.

The column control circuitry 210 on the control die 204 is divided into first column control circuitry 210(1) and second column control circuitry 210(2). First column control circuitry 210(1) is connected to the data bit lines on first memory die 200(1). Second column control circuitry 210(2) is connected to the dummy bit lines on second memory die 200(1). For ease of depiction only the connections to bit lines 537, 538, 539, and 549 are depicted; however, the other data bit lines in memory die 200(1) have similar connections to first column control circuitry 210(1) and the other dummy bit lines in memory die 200(1) have similar connections to second column control circuitry 210(2). Because the dummy bit lines on memory die 200(1) are connected to the data bit lines on first memory die 200(2) the second column control circuitry 210(2) is connected to the data bit lines on second memory die 200(2). The first bit line bond pad pairs 242 are depicted, showing how the electrical pathway from the column control circuitry 210 to a bit line on the first memory die 200(1) may include a bond pad pair 242.

In one embodiment, memory operations may be performed in parallel in corresponding sub-blocks in the two memory dies 200(1), 200(2). For example, first column control circuitry 210(1) may be used to control the memory operation in a selected sub-block in the first memory die 200(1) while the second column control circuitry 210(2) is used to control the memory operation in a selected sub-block in the second memory die 200(2). As one example, a 16K data page might be programmed as 8K of data in memory die 200(1) in parallel with 8K of data in memory die 200(2). Reading could also be performed in parallel.

Figure 6A:
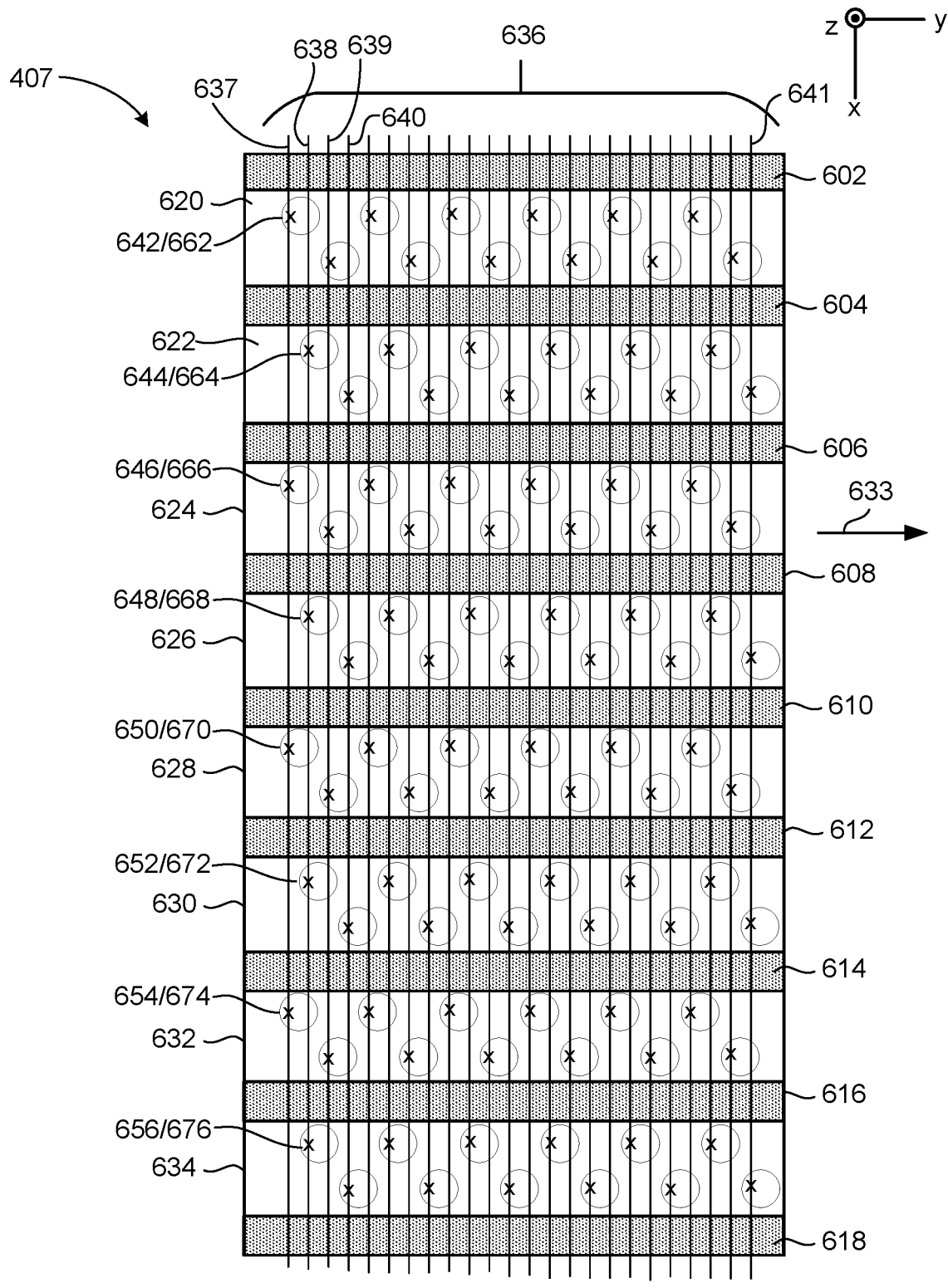
FIG. 6A is a block diagram depicting a top view of one embodiment of a portion 407 of Block 2 of plane 400(0) in which there are two sets of data bit lines but no dummy bit lines.

In one embodiment, the memory die 200(1) that is bonded to the control die 204 does not have dummy bit lines. FIG. 6A is a block diagram depicting a top view of one embodiment of a portion 407 of Block 2 of plane 400(0) in which there are two sets of data bit lines but no dummy bit lines. As can be seen from FIG. 6A, the block depicted in FIG. 6A extends in the direction of arrow 633. In one embodiment, the memory array has many layers; however, FIG. 6A only shows the top layer.

FIG. 6A depicts vertical columns 642, 644, 646, 648, 650, 652, 654, and 656. Vertical column 642 implements NAND string 662. Vertical column 644 implements NAND string 664. Vertical column 646 implements NAND string 666. Vertical column 648 implements NAND string 668. Vertical column 650 implements NAND string 670. Vertical column 652 implements NAND string 672. Vertical column 654 implements NAND string 674. Vertical column 656 implements NAND string 676.

FIG. 6A also depicts a set of bit lines 636, including bit lines 637, 638, 639, 640 . . . 641. FIG. 6A shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 637 is connected to vertical columns 642, 646, 650, and 654. Bit line 638 is connected to vertical columns 644, 648, 652, and 656. All of the bit lines 636 are data bit lines. Note that FIG. 6A depicts 24 bit lines, but only 12 NAND strings per sub-block. Thus, there are twice as many bit lines as NAND strings per sub-block.

The block depicted in FIG. 6A includes a set of isolation regions 602, 604, 606, 608, 610, 612, 614, 616, and 618, which are formed of $SiO_2$; however, other dielectric materials can also be used. Isolation regions 602, 604, 606, 608, 610, 612, 614, 616, and 618 serve to divide the top layers of the block into eight regions; for example, the top layer depicted in FIG. 6A is divided into regions 620, 622, 624, 626, 628, 630, 632, and 634, each of which serves as a drain side select line (SGD). Each SGD may be used to select the NAND strings in that region. Thus, each SGD may be used to select a different group of the NAND strings in the block. Regions 620, 622, 624, 626, 628, 630, 632, and 634 correspond to sub-blocks. In one embodiment, isolation regions 602 and 618 separate the block from adjacent blocks. Thus, isolation regions 602 and 618 may extend down to the substrate. In one embodiment, the isolation regions 604, 606, 608, 610, 612, 614, 616 only divide the layers used to implement select gates so that NAND strings in different sub-blocks can be independently selected.

In one embodiment, a data bit line only connects to a vertical column/NAND string in half of the regions (or sub-blocks). For example, bit line 637 is connected to vertical columns 642, 646, 650, and 654 in regions 620, 624, 628, and 632, respectively. Bit line 638 is connected to vertical columns 644, 648, 652, and 656 in regions 622, 626, 630, and 634, respectively. In an alternative arrangement, bit line 638 may be connected to vertical columns 642, 646, 650, and 654 in regions 620, 624, 628, and 632, respectively, whereas bit line 637 may be connected to vertical columns 644, 648, 652, and 656 in regions 622, 626, 630, and 634, respectively. In one embodiment, the first memory die 200(1) has the arrangement depicted in FIG. 6A and memory die 200(2) has the aforementioned alternative arrangement. In one embodiment, the second memory die 200(2) has the arrangement depicted in FIG. 6A and first memory die 200(1) has the aforementioned alternative arrangement.

Figure 6B:
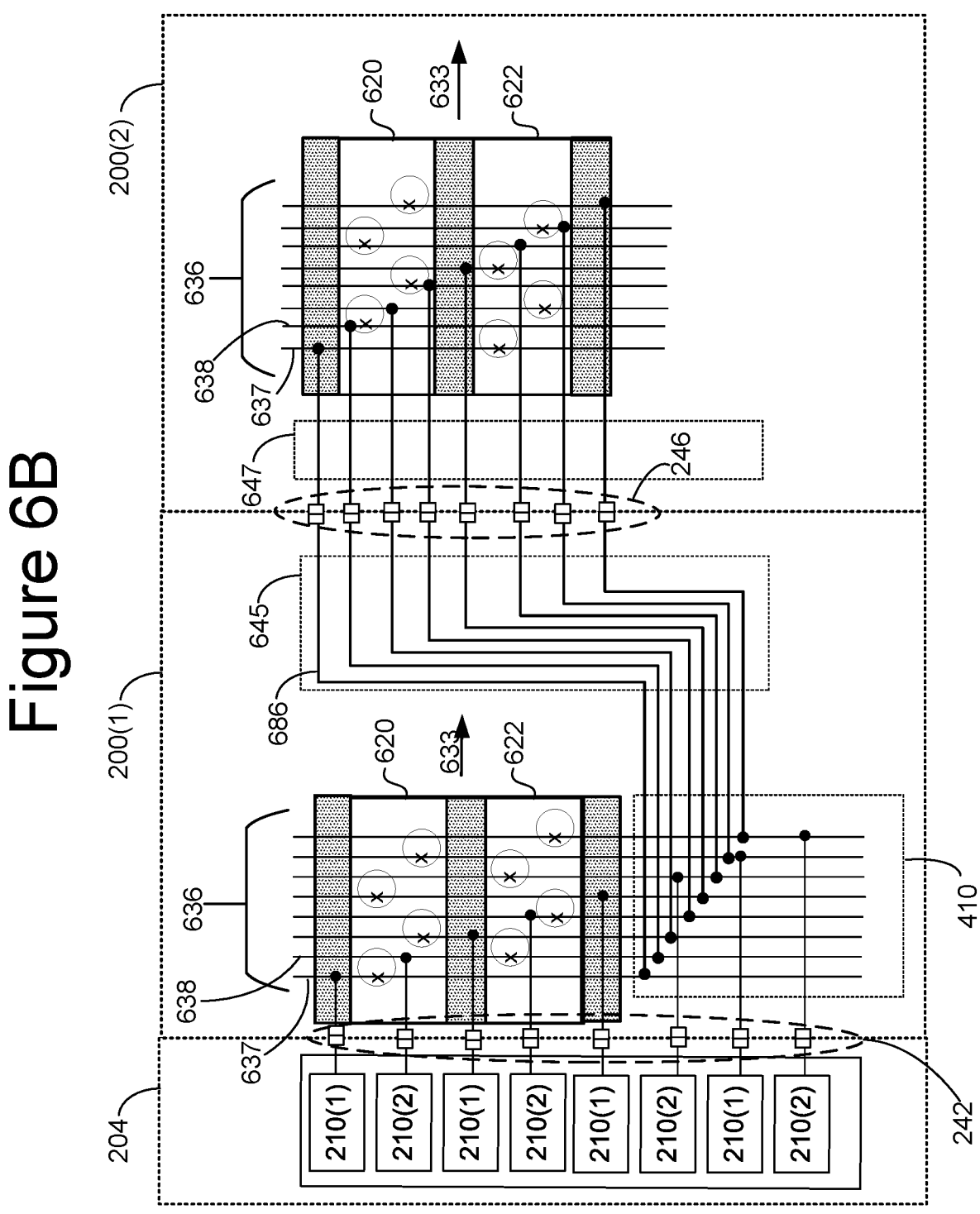
FIG. 6B is diagram depicting one embodiment of electrical connections between column control circuitry on the control die and bit lines in memory dies.

FIG. 6B is diagram depicting one embodiment of electrical connections between column control circuitry 210 on the control die 204 and bit lines in memory dies 200. Each memory die 200(1), 200(2) has only data bit lines consistent with the example of FIG. 6A. Each data bit line of the first memory die 200(1) is electrically connected to a data bit line on the second memory die 200(2). For example, electrical pathway 686 connects bit line 637 on the first memory die 200(1) with bit line 637 on the second memory die 200(2). Similar electrical pathways connect other bit lines on first memory die 200(1) to other bit lines on second memory die 200(2). The electrical pathways may be routed through one or more metal layers (and vias) in a die. Region 645 in first memory die 200(1) may include one or more metal layers (and vias). Region 647 in second memory die 200(2) may have one or more metal layers (and vias) through which the electrical pathways are routed. The second bit line bond pad pairs 246 are depicted, showing that each electrical pathway includes one of the second bit line bond pad pairs 246. The electrical pathways may be routed through a bit line break region 410. For example, the first memory die 200(1) has a first bit line break region 410. However, the connections between the bit lines and the sub-blocks are different between the two memory dies 200(1), 200(2). For example, bit line 637 on first memory die 200(1) connects to a NAND string in sub-block 620, whereas bit line 637 on second memory die 200(2) connects to a NAND string in sub-block 622. Bit line 638 on first memory die 200(1) connects to a NAND string in sub-block 622, whereas bit line 638 on second memory die 200(2) connects to a NAND string in sub-block 620.

The column control circuitry 210 on the control die 204 is divided into first column control circuitry 210(1) and second column control circuitry 210(2). First column control circuitry 210(1) is connected to the bit lines that connect to NAND strings in sub-block 620 in the first memory die 200(1). Second column control circuitry 210(2) is connected to the bit lines that connect to NAND strings in sub-block 622 in the first memory die 200(1). This alternating pattern may be repeated such that first column control circuitry 210(1) is connected to the bit lines that connect to NAND strings in alternating sub-blocks (e.g., sub-blocks 620, 624, 628, and 632) in the first memory die 200(1) and second column control circuitry 210(2) is connected to the bit lines that connect to NAND strings in alternating sub-blocks (e.g., sub-blocks 622, 626, 630, and 634) in the first memory die 200(1).

In one embodiment, memory operations may be performed in parallel in corresponding sub-blocks in the two memory dies 200(1), 200(2). For example, if sub-block 620 is selected in each memory die 200(1), 200(2) first column control circuitry 210(1) may be used to control the memory operation in sub-block 620 in the first memory die 200(1) while second column control circuitry 210(2) is used to control the memory operation in sub-block 620 in the second memory die 200(2). If sub-block 622 is selected in each memory die, first column control circuitry 210(1) may be used to control the memory operation in sub-block 622 in the second memory die 200(2) while second column control circuitry 210(2) is used to control the memory operation in sub-block 622 in the first memory die 200(1).

Figure 7A:
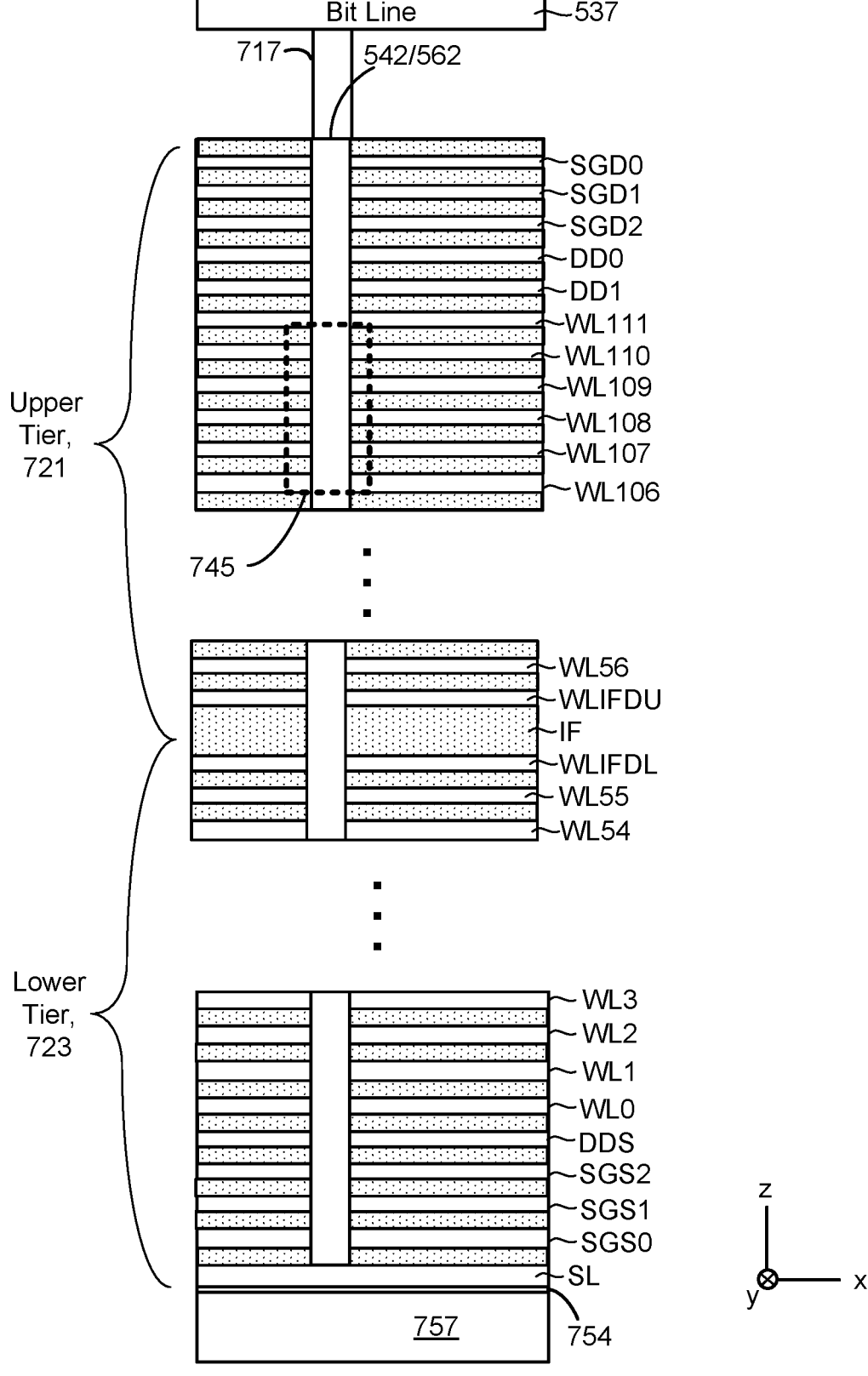
FIG. 7A depicts a portion of one example of a three dimensional memory structure showing a cross-sectional view along line AA of FIG. 5A.

FIG. 7A depicts a portion of one example of a three dimensional memory structure 202 showing a cross-sectional view along line AA of FIG. 5A. This cross sectional view cuts through vertical column (NAND string) 542/562 of region 520 (see FIG. 5A). The structure of FIG. 7A includes three drain side select gate layers (SGD0, SGD1 and SGD2). The structure of FIG. 7A also includes three source side select gate layers (SGS0, SGS1 and SGS2). The structure of FIG. 7A also includes five dummy word line layers DD0, DD1, WLIFDU, WLIDDL, DDS; one hundred twelve word line layers WL0-WL111 for connecting to data memory cells. Dielectric layers are depicted between the conductive layers just described. Other examples can implement more or fewer than the numbers described above for FIG. 7A. In one example, SGD0, SGD1 and SGD2 are electrically connected together; and SGS0, SGS1 and SGS2 are electrically connected together.

FIG. 7A depicts an example of a stack having two tiers. The two-tier stack comprises an upper tier 721 and a lower tier 723. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 721 and the lower tier 723 are erased independent of one another. Hence, data may be maintained in the lower tier 723 after the upper tier 721 is erased. Likewise, data may be maintained in the upper tier 721 after the lower tier 723 is erased.

Vertical column 542 is depicted protruding through the drain side select layers, source side select layers, IF layer, dummy word line layers and word line layers. In one embodiment, each vertical column comprises a vertical NAND string. Below the vertical columns and the layers listed below is substrate 757, an insulating film 754 on the substrate, and source line SL. The NAND string 562 of vertical column 542 has a source end at a bottom of the stack and a drain end at a top of the stack. As in agreement with FIG. 5A, FIG. 7A show vertical column 542 connected to bit line 537 via connector 717. Note that dummy bit lines will not have such connectors 717 to NAND strings.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielec-tric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W111 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 7B:
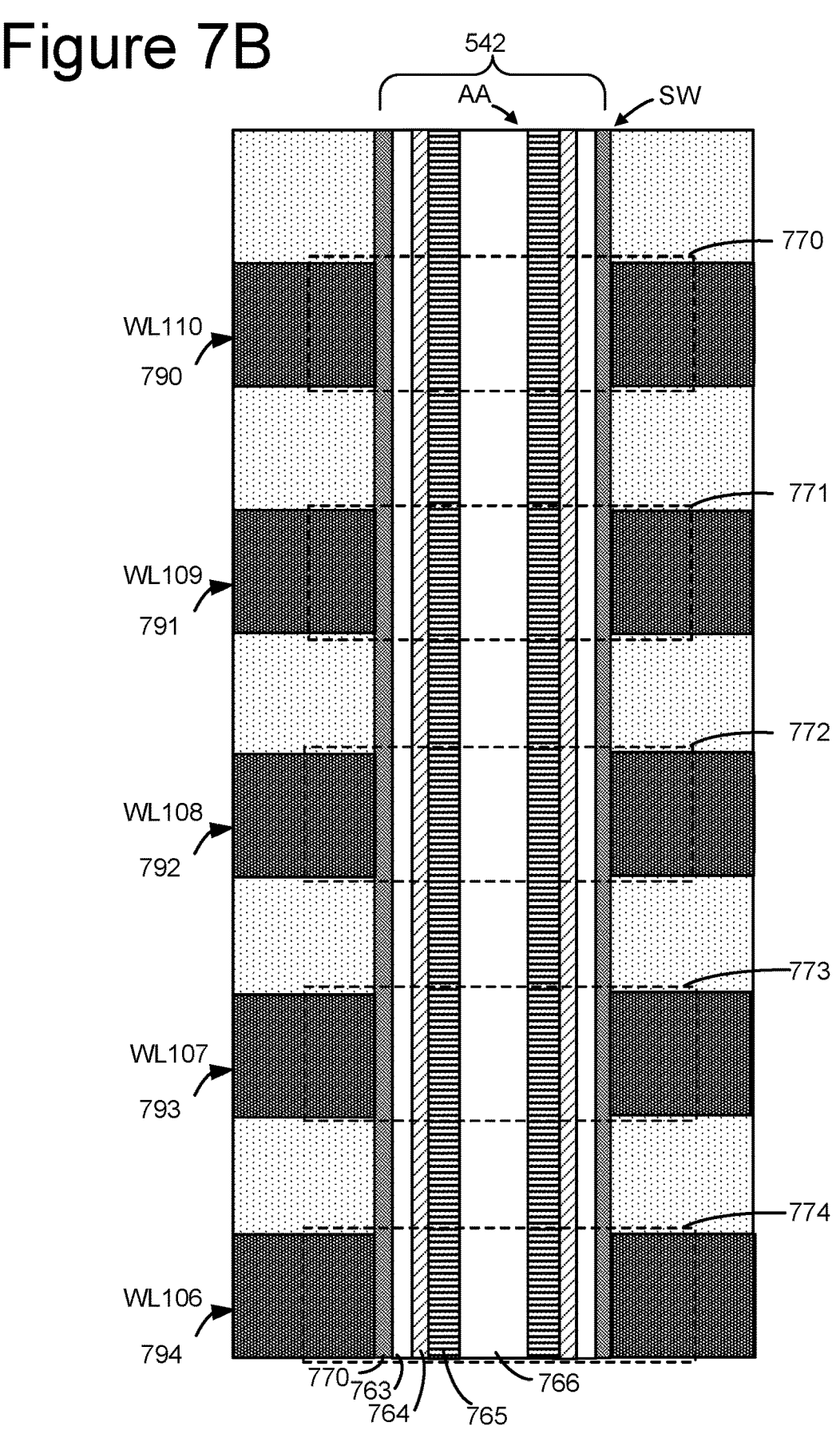
FIG. 7B depicts a view of the region 745 of FIG. 7A.

FIG. 7B depicts a view of the region 745 of FIG. 7A. Included are WL106-110 and dielectric layers between the word line layers. Data memory cell transistors 770, 771, 772, 773, and 774 are indicated by the dashed lines. A number of layers can be deposited along the sidewall (SW) of the memory hole 542 and/or within each word line layer, e.g., using atomic layer deposition. For example, each column (e.g., the pillar which is formed by the materials within a memory hole) can include a blocking oxide/block high-k material 770, charge-trapping layer or film 763 such as SiN or other nitride, a tunneling layer 764, a polysilicon body or channel 765, and a dielectric core 766. A word line layer can include a conductive metal such as Tungsten as a control gate. For example, control gates 790, 791, 792, 793 and 794 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 764 can comprise multiple layers such as in an oxide-nitride-oxide configuration.

Figure 7C:
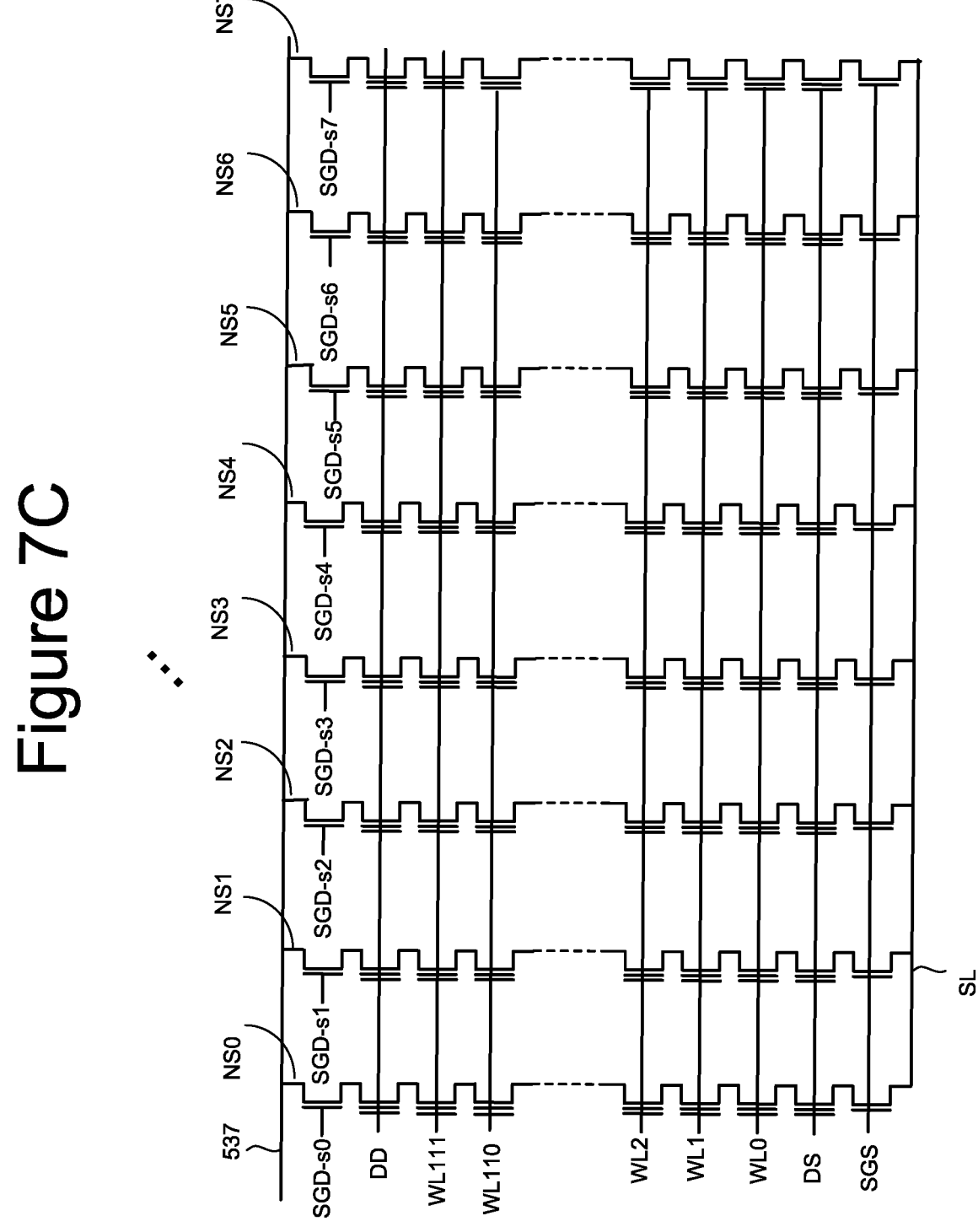
FIG. 7C is a schematic diagram of a portion of the memory consistent with the examples in FIGS. 5A and 5B.

FIG. 7C is a schematic diagram of a portion of the memory consistent with the examples in FIGS. 5A and 5B. FIG. 7C shows physical word lines WL0-WL111 running across the entire block. One of the bit lines 537 is depicted with its connection to eight NAND strings in the block. Other bit lines are not depicted. Drain side selection lines SGD-s0, SGD-s1, SGD-s2, SGD-s3, SGD-s4, SGD-s5, SGD-s6, and SGD-s7 are used to determine which of the eight NAND strings (NS0, NS1, NS2, NS3, NS4, NS5, NS6, or NS7) connects to the associated bit line 537. Other NAND strings of the block and other bit lines are not depicted in FIG. 7C. Note that with respect to FIG. 5A SGD-s0 may correspond to region 520, SGD-s1 may cor-respond to region 522, SGD-s2 may correspond to region 524, SGD-s3 may correspond to region 526, SGD-s4 may correspond to region 528, SGD-s5 may correspond to region 530, SGD-s6 may correspond to region 532, and SGD-s7 may correspond to region 534. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5. A seventh sub-block corresponds to those vertical NAND strings controlled by SGD-s6. An eighth sub-block corresponds to those vertical NAND strings controlled by SGD-s7. There may be more or fewer than eight sub-blocks in a block. FIG. 7C shows that SGD select line connects to an SGD transistor on one of the NAND strings. There are many other NAND strings in the block that are not depicted in FIG. 7C. Each SGD select line will connect to all of the NAND strings in one sub-block. The SGD transistor may be used to connect/disconnect the NAND string channel to/from the bit line. A source side selection line SGS connects/disconnects the NAND strings to/from the common source line. In some embodiments, there is a source side selection line for each sub-block (similar to the eight SGD-s0, SGD-s1, SGD-s2, SGD-s3, SGD-s4, SGD-s5, SGD-s6, and SGD-s7).

Figure 8A:
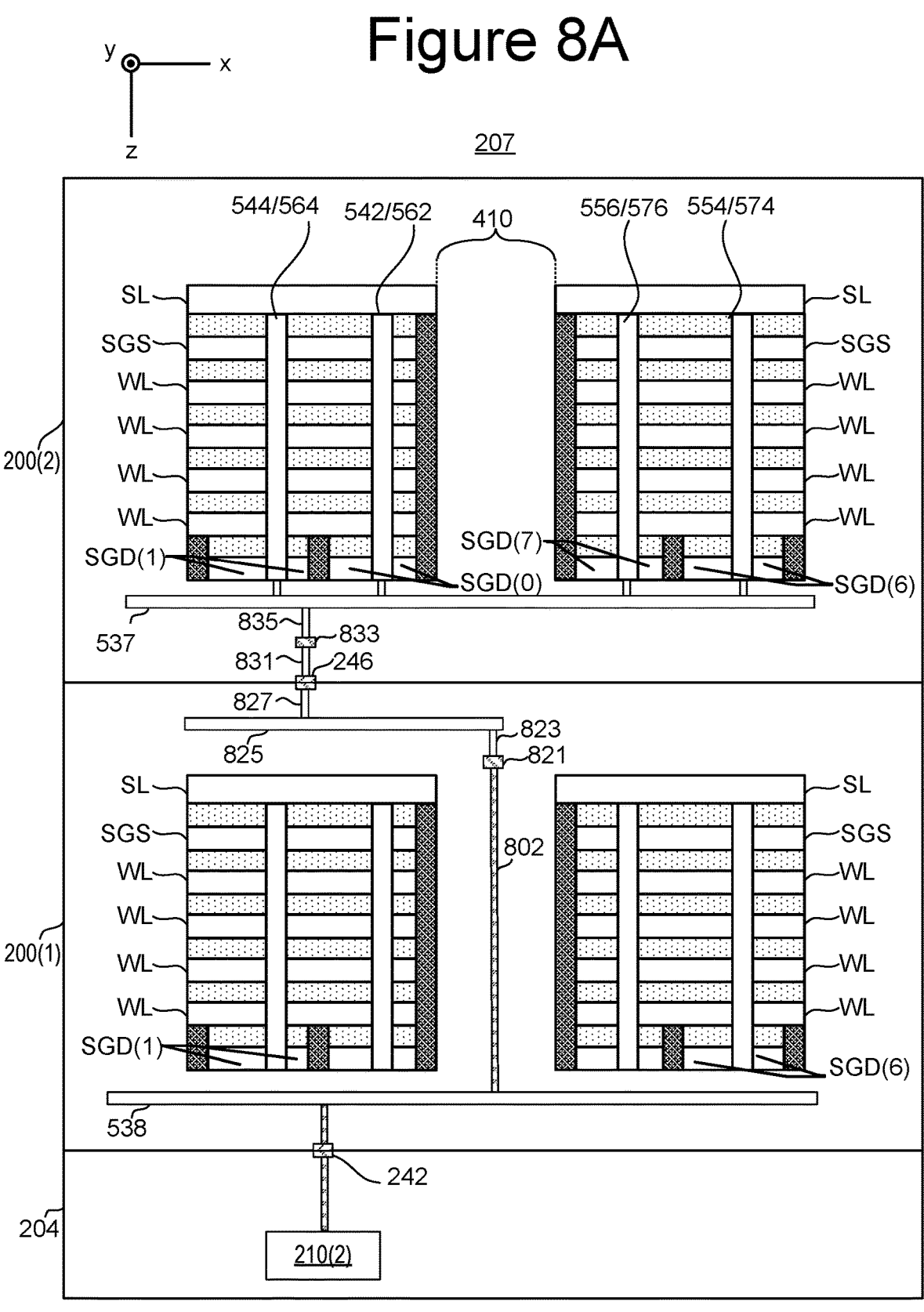
FIGS. 8A and 8B depict embodiments of an integrated memory assembly having a separate bit line architecture.

FIG. 8A depicts further details of how an electrical connection may be made from a dummy bit line in the first memory die 200(1) to a data bit line in the second memory die 200(2). A portion of two blocks with the bit line break 410 between the two blocks is depicted for each memory die 200(1), 200(2). The two blocks could correspond to, for example, Block P+1 and Block P (see FIG. 4B). The memory structures in each die include alternating conductive layers and insulating layers The conductive layers may serve as word line layers or select layers. Each memory structure has a source line SL layer, source side select layer (SGS), multiple word line layers (WL), and a drain side select layer (SGD). There may be many more layers in each memory structure 202. Each of these layers may be broken into different regions as has been discussed above. FIG. 8A corresponds to an example in which the SGD layer is separated into eight regions in each block. Four of those SGD regions (SGD(0), SGD(1), SGD(6) and SGD(7)) are depicted for each die 200(1), 200(2) in FIG. 8A. FIG. 8A shows some of the vertical column/NAND strings 554/574, 556/576, 542/562, 544/564. Note that vertical column/NAND strings 554/574, 556/576 are in one Block and vertical column/NAND strings 542/562, 544/564 are in an adjacent Block (separated by BL break region 410).

FIG. 8A shows an embodiment of a connection between dummy bit line 538 in the first memory die 200(1) to data bit line 537 in the second memory die 200(2). The second column control circuitry 210(2) in the control die 204 connects to the dummy bit line 538. A vias 802 in the first memory die 200(1) is used for a portion of the electrical pathway that connects the dummy bit line 538 to the data bit line 538 in the second memory die 200(2). In one embodiment, the via 802 is located in the BL break region 410 of the first memory die 200(1). Each memory die 200 may have one or more metal layers (and vias) in which the electrical pathway is routed. In the embodiment depicted in FIG. 8A, via 802 is connected to a metal line 821 in a first metal layer, which is connected to a via 823. The via 823 is connected to a metal line 825 in a second metal layer. The metal line 825 is connected to via 827. FIG. 8A shows a metal line 833 in a metal layer of the second memory die 200(2). The metal line 833 is connected to vias 831, 835. Metal layers in the control die 204 are not depicted. There could be more or fewer metal layers (and vias) in the memory dies 200 for routing the electrical pathway. There are other possible alternatives to the routing, as well as the location of the bond pad pairs 242, 246.

In one embodiment, the control die 204 will perform a memory operation (e.g., program, read) in parallel in a sub-block in the first memory die 200(1) and a sub-block of the second memory die 200(2). For example, the control die 204 may select SGD(1) in each die 200(1), 200(2). In this example, second column control circuitry 210(2) may be used to control bit line 537 in the second memory die 200(2). Also, first column control circuitry 210(1) may be used to control bit line 537 in the first memory die 200(1) (see FIG. 5C).

Figure 8B:
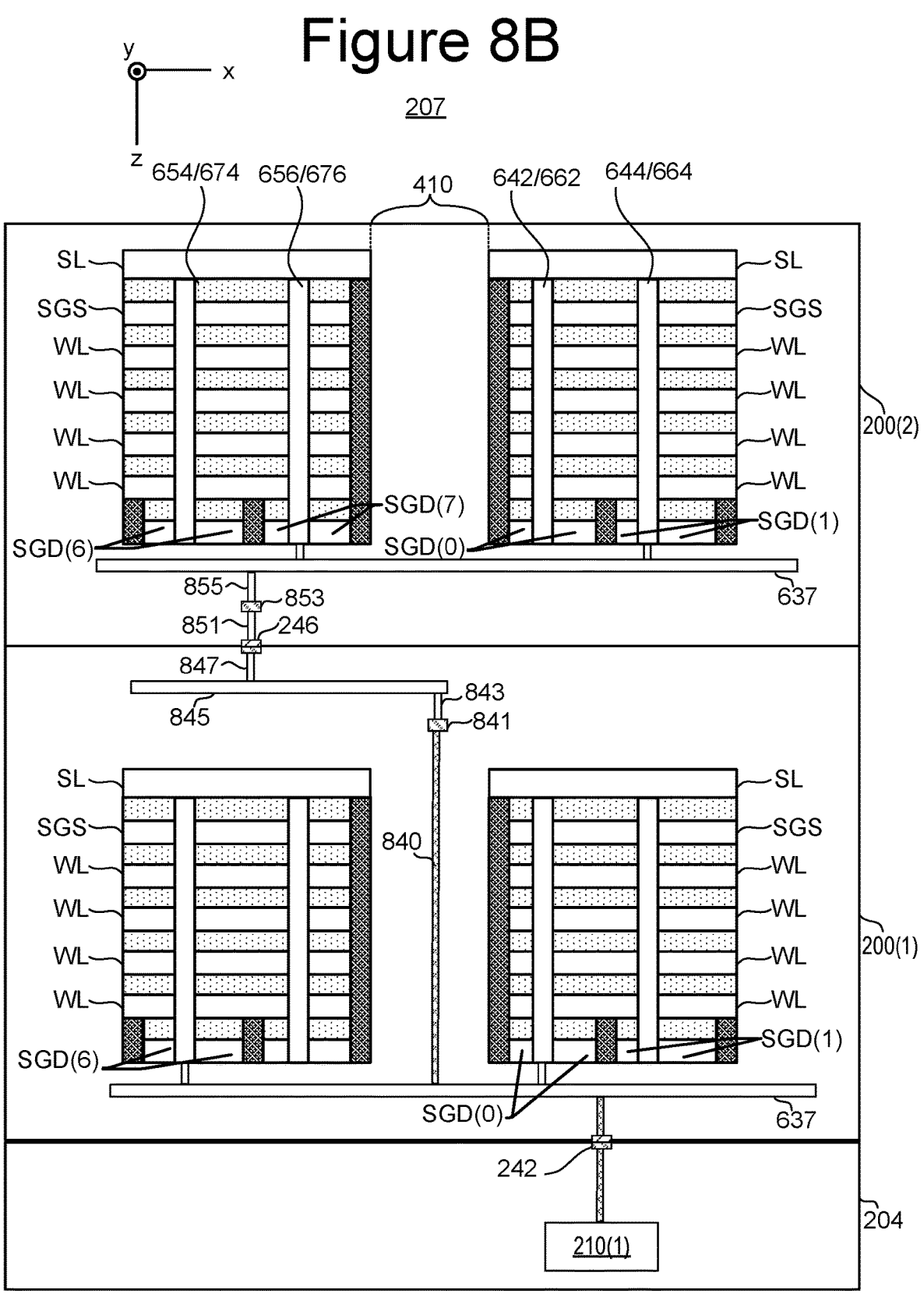

FIG. 8B depicts further details of how a connection may be made from a data bit line in the first memory die 200(1) to a data bit line in the second memory die 200(2). A portion of two blocks with the bit line break 410 between the two blocks is depicted for each memory die 200(1), 200(2). FIG. 8B shows some of the vertical column/NAND strings 654/674, 656/676, 642/662, 644/664. Note that vertical column/NAND strings 654/674, 656/676 are in one Block and vertical column/NAND strings 642/662, 644/64 are in an adjacent Block (separated by BL break region 410).

FIG. 8B shows an embodiment of a connection between data bit line 637 in the first memory die 200(1) to data bit line 637 in the second memory die 200(2). The first column control circuitry 210(1) in the control die 204 connects to the data bit line 637. A via 840 in the first memory die 200(1) is used for a portion of the electrical pathway that connects the data bit line 637 in first memory die 200(1) to the data bit line 637 in the second memory die 200(2). In one embodiment, the via 840 is located in the BL break region 410 of the first memory die 200(1). Each memory die may have one or more metal layers (and vias) in which the electrical pathway is routed. In the embodiment depicted in FIG. 8B, via 840 is connected to a metal line 841 in a first metal layer, which is connected to a via 843. The via 843 is connected to a metal line 845 in a second metal layer. The metal line 845 is connected to via 847. FIG. 8B shows a metal line 853 in a metal layer of the second memory die 200(2). The metal line 853 is connected to vias 851, 855. Metal layers in the control die 204 are not depicted. There could be more or fewer metal layers (and vias) in the memory dies 200 for routing the electrical pathway. There are other possible alternatives to the routing, as well as the location of the bond pad pairs 242, 246.

In one embodiment, the control die 204 will perform a memory operation (e.g., program, read) in parallel in a sub-block in the first memory die 200(1) and a sub-block of the second memory die 200(2). For example, the control die 204 may select SGD(1) in each die 200(1), 200(2). In this example, first column control circuitry 210(1) will be used to control bit line 637 in the second memory die 200(2). Also, second column control circuitry 210(2) may be used to control bit line 638 in the first memory die 200(1) (see FIG. 6B). At a different point in time the control die 204 may select SGD(0) in each die 200(1), 200(2). In this example, first column control circuitry 210(1) may be used to control bit line 637 in the first memory die 200(1). Also, second column control circuitry 210(2) may be used to control bit line 638 in the second memory die 200(2) (see FIG. 6B).

In some embodiments, corresponding word line layers of two adjacent memory dies 200 are shorted together. FIG. 9A depicts an architecture referred to herein as a "shorted WL architecture". Each memory structure 202(1), 202(2) has a staircase shape 910(1), 910(2) at an edge to allow connections to the word line layers, as well as the select line layers. There may be multiple staircases 910, although only one per die is depicted in FIG. 9A. One possible location for a staircase 910 is an edge of a block (at the y-most extent). In one embodiment, a staircase 910 is located at about the mid-point of a block (e.g., midpoint of line in y-direction). Electrical pathways connect the aforementioned WL layer in memory structure 202(1) with a corresponding WL layer in memory structure 202(2). There are a number of ways to route the electrical pathway. In an embodiment depicted in FIG. 9A, via 906 is connected to a metal line 943 in a metal layer of second memory die 200(2), which is connected to a via 941. Metal line 935 in a metal layer of the first memory die 200(1) connects to via 937. The metal line 935 is connected to via 933, which connects to metal line 931. Via 905 connects metal line 927 in a metal layer of the first memory die 200(1). The metal line 927 is connected to via 904, which connect to a word line layer in the first memory die 200(1). First memory die 200(1) also has vias 921, 925 and metal line 923 in another metal layer. Metal layers in the control die 204 are not depicted. Each memory die 200 may have more or fewer metal layers (and vias) for routing. There are other possible alternatives to the routing, as well as the location of the bond pad pairs 242, 246.

Therefore, WL driver 224 may be used provide an operating voltage to both WL layers at the same time. Other conductive layers in the first memory structure 202(1) may be connected to corresponding conductive layers in memory structure 202(2) in a similar manner. In one embodiment, the shorted WL architecture is combined with a separate BL architecture. For example, the shorted WL architecture may be combined with any of the examples of FIGS. 5A, 5B, 5C, 6A, 6B, 8A, and/or 8B.

Figure 9B:
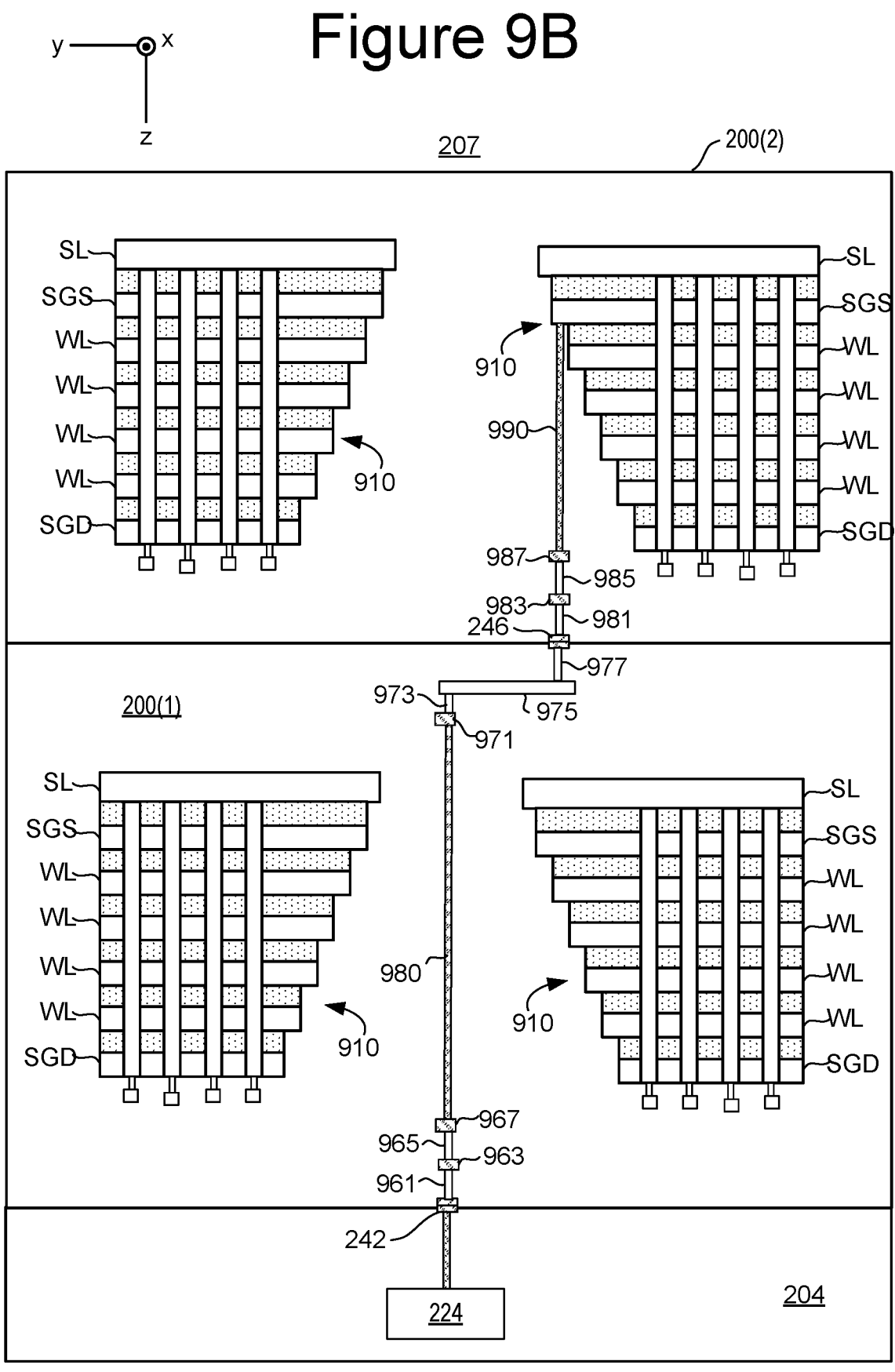
FIG. 9B depicts an integrated memory assembly having a separate word architecture.

In some embodiments, word line layers of two adjacent memory dies 200 are not shorted together in what is referred to herein as a "separate WL architecture." FIG. 9B depicts an architecture referred to herein as a "separate WL architecture". The memory structures 202(1), 202(2) are depicted so as to show the staircase shapes 910 that allow connections to the word line layers, as well as the select line layers.

There are a number of ways to route the electrical pathway from the WL driver 224 and the WL layer in the second semiconductor die 200(2). In an embodiment depicted in FIG. 9B, first memory die 200(1) has vias 961, 965 and metal lines 963, 967 in metal layers. Via 980 connects to a metal line 971 in another metal layer. Via 973 connects to metal line 975 in another metal layer. Via 977 connects to a bond pad in bond pad pair 246. Second memory die 200(2) has vias 981, 985, and 990, which connects to the WL layer. Also depicted are metal lines 983, 987 in different metal layers. Metal layers in the control die 204 are not depicted. Each memory die 200 could have more or fewer metal layers (and vias) for routing. There are other possible alternatives to the routing, as well as the location of the bond pad pairs 242, 246. Therefore, the WL driver 224 connects to the WL layer in the second memory die 200(2). Connections to other word line layers in the second memory die 200(2) may be made in a similar manner by vias through the BL break region 410 of the first memory die 200(1). The connections between WL drivers and the WL layers of the first memory die 200(1) may be made in a similar manner as the connections depicted in FIG. 9A (but without shorting the WL layers to corresponding WL layers in the second memory due 200(2)).

In some embodiments, the integrated memory assembly 207 has a hybrid architecture that combines a separate architecture with a shorted architecture. For example, a separate BL architecture may be combined with a shorted BL architecture. Also, a separate WL architecture may be combined with a shorted WL architecture. Furthermore, the combination of separate BL, shorted BL, separate WL, and shorted WL may be used.

Figure 10A:
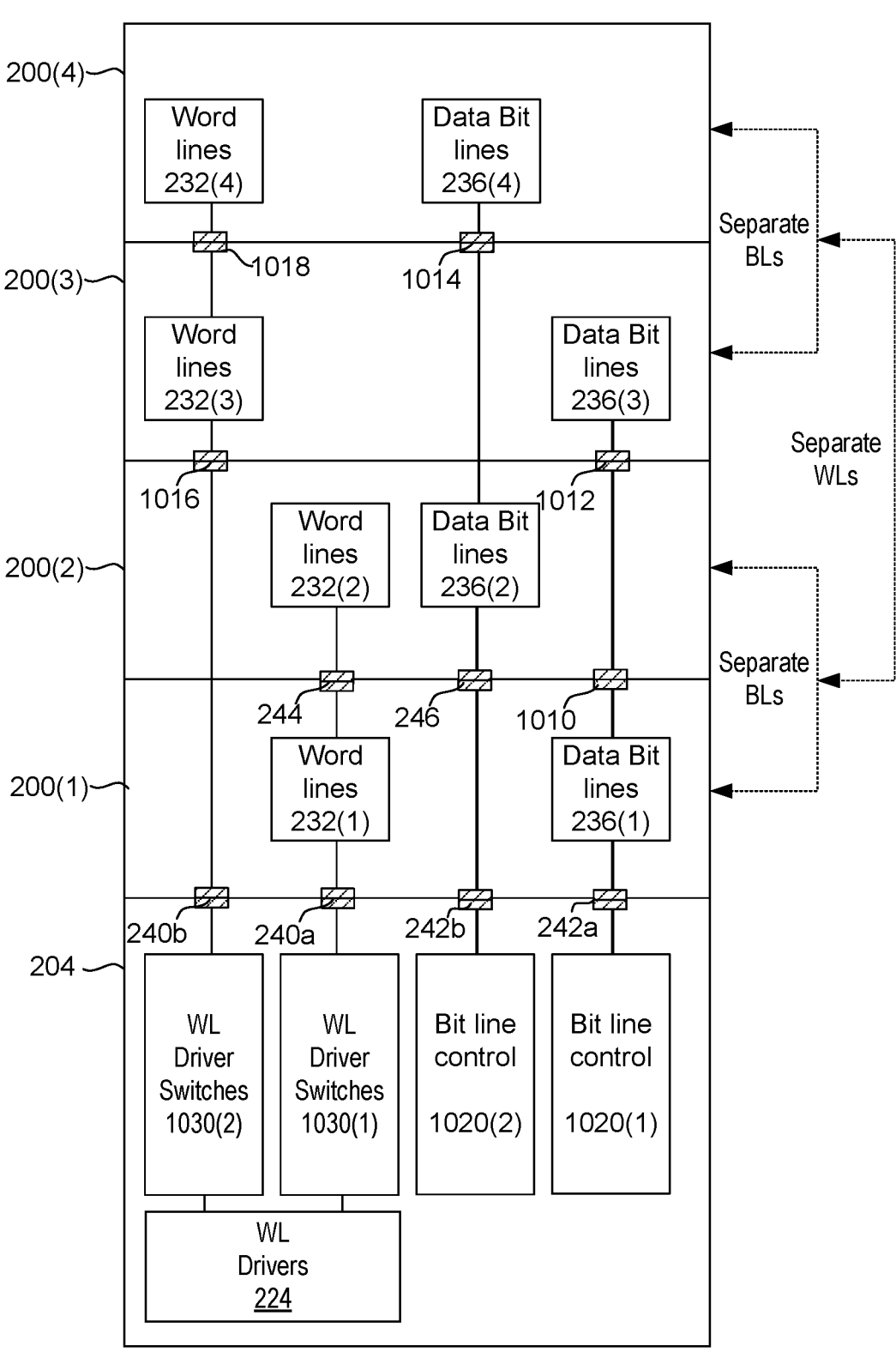
FIGS. 10A, 10B, and 10C depict embodiments of an integrated memory assembly having a hybrid architecture.

In one embodiment, the integrated memory assembly 207 has a control die 204 and four memory dies 200 bonded together. Such a device may have a hybrid architecture. FIG. 10A depicts one embodiment of an integrated memory assembly 207 having a control die 204 and four memory dies 200(1), 200(2), 200(3), 200(4). The integrated memory assembly 207 has one embodiment of a hybrid architecture. The hybrid architecture combines different techniques for making the connections of circuitry in the control die 204 to the memory dies 200. The control die 204 is bonded to the first memory die 200(1) with bond pad pairs 240a, 240b, 242a, 242b. The first memory die 200(1) is bonded to the second memory die 200(2) by bond pad pairs 244, 246, 1010. The second memory die 200(2) is bonded to the third memory die 200(3) by bond pad pairs 1012, 1016. The third memory die 200(3) is bonded to the fourth memory die 200(4) by bond pad pairs 1014, 1018. Each of the aforementioned bond pad pairs may have a bond pad on each of the two adjacent dies that are bonded together. It may further be stated that the first pair of memory dies (200(1), 200(2)) are bonded to the second pair of memory dies (200(3), 200(4)). It may further be stated that the first pair of memory dies (200(1), 200(2)) are bonded to the control die 204.

In an embodiment of a hybrid architecture, memory dies 200(1), 200(2) form a first die pair having what is referred to herein as a separate bit line architecture. Memory dies 200(3), 200(4) form a second die pair having the separate bit line architecture. Moreover, the first die pair (200(1), 200(2)) and the second die pair (200(3), 200(4))) have what is referred to herein as a separate word line architecture.

The control die 204 has first bit line control circuits 1020(1) and second bit line control circuits 1020(2). The bit line control circuits contain sense amplifiers and bit line drivers. The bit line drivers may be incorporated into the sense amplifiers. A bit line control circuit may also be referred to as a column control circuit due to a convention of referring to bit lines as being organized as columns. The first bit line control circuits 1020(1) connect to and are able to control the first data bit lines 236(1) in first memory die 200(1). The second bit line control circuits 1020(2) connect to and are able to control the second data bit lines 236(2) in second memory die 200(2). Memory dies 200(1), 200(2) have a "separate bit line architecture" due to this architecture in which the first data bit lines 236(1) are not connected to the second data bit lines 236(2) and that two different sets of bit line control circuits 1020(1), 1020(2) are able to operate the respective data bit lines 236(1), 236(2) in parallel.

Further note that the first data bit lines 236(1) in the first memory die 200(1) are connected to the third data bit lines 236(3) in the third memory die 200(3). Likewise, the second data bit lines 236(2) in the second memory die 200(2) are connected to the fourth data bit lines 236(4) in the fourth memory die 200(4). The first bit line control circuits 1020(1) connect to and are able to control the third data bit lines 236(3) in first memory die 200(3). The second bit line control circuits 1020(2) connect to and are able to control the fourth data bit lines 236(4) in fourth memory die 200(4). However, the control die 204 will select either the first die pair 200(1), 200(2) or the second die pair 200(3), 200(4) for a memory operation at one point in time. Memory dies 200(3), 200(4) have a "separate bit line architecture" due to the architecture in which the third data bit lines 236(3) are not connected to the fourth data bit lines 236(4) and that two different sets of bit line control circuits 1020(1), 1020(2) are able to operate the respective data bit lines 236(3), 236(4) in parallel. As one example, first bit line control circuits 1020(1) could control 8K data bit lines in memory die 200(1) while second bit line control circuits 1020(2) control 8K data bit lines in memory die 200(2) at one point in time. At a different point in time first bit line control circuits 1020(1) could control 10K data bit lines in memory die 200(3) while second bit line control circuits 1020(2) control 10K data bit lines in memory die 200(4).

Word lines 232(1) in the first memory die 200(1) are connected to corresponding word lines 232(2) in the second memory die 200(2) in what is referred to herein as a connected WL architecture. Word lines 232(3) in the third memory die 200(3) are connected to corresponding word lines 232(4) in the fourth memory die 200(4) in the connected WL architecture. The corresponding word lines refers to the layer at which the word line resides. Referring briefly to FIG. 7A, WL0 on one die may be connected to WL0 on another die, WL1 on one die may be connected to WL1 on another die, etc. In one embodiment, the connections are made in a word line hookup region. However, the word lines in first die pair (200(1), 200(2)) are not connected to the word lines in the second die pair (200(3), 200(4)), which is referred to herein as a separate WL architecture.

As noted above, the control die may perform a memory operation in parallel in the first die pair (200(1), 200(2)). During that memory operation the WL drivers 224 may be used to provide voltages to both the first word lines 232(1) and the second word lines 232(2). For example, a program voltage may be provided to a selected word line in first word lines 232(1) and also to a selected word line in the second word lines 232(2). As noted above, the control die 204 may perform a memory operation in parallel in the second die pair (200(3), 200(4)). During that memory operation the WL drivers 224 may be used to provide voltages to both the third word lines 232(3) and the fourth word lines 232(4). The first word line switches 1030(1) may be used when performing memory operations in the first die pair (200(1), 200(2)). The second word line switches 1030(3) may be used when performing memory operations in the second die pair (200(3), 200(4)).

Note that the hybrid architecture depicted in FIG. 10A combines a shorted WL approach with a separate WL approach. An advantage of using the shorted WL approach (for die pair 200(1), 200(2) and die pair 200(2), 200(4)) is that it reduces the number of vias that are needed in the memory dies to provide the connections to the word lines. For example, the number of vias in memory die 200(1) may be cut in half by using the shorted WL approach for the die pairs. Additionally, the number of WL switches may be reduced relative to an architecture in which no word lines are shorted between memory dies.

Figure 10B:
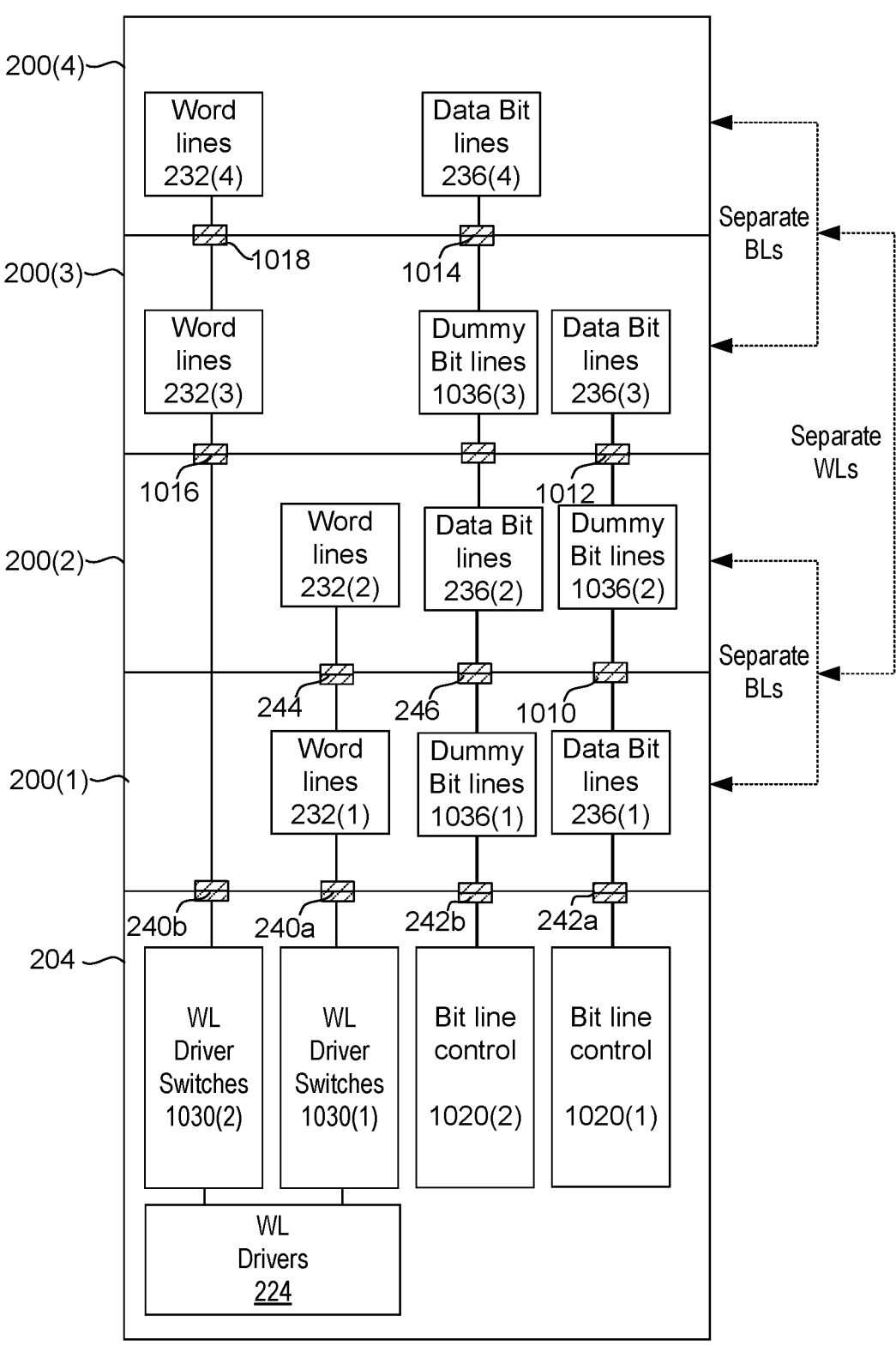

FIG. 10B depicts one embodiment of an integrated memory assembly 207 having a hybrid architecture. An embodiment of the hybrid architecture uses dummy bit lines for routing in at least some of the memory dies 200. Memory die 200(1) has dummy bit lines 1036(1) that are used to connect the second bit line control 1020(2) to the data bit lines 236(2) in the second memory die 200(2). Memory die 200(2) has dummy bit lines 1036(2) that are used to connect the first data bit lines 236(1) in the first memory die 200(1) to the third data bit lines 236(3) in the third memory die 200(1). In one embodiment, the bit line connections for memory die 200(1), 200(2) in FIG. 10B are similar to those shown and described with respect to FIGS. 5A-5C and/or 8A. Memory die 200(3) has dummy bit lines 1036(3) that are used to connect the second data bit lines 236(2) in the second memory die 200(2) to the fourth data bit lines 236(4) in the fourth memory die 200(4). Note that the data bit lines 236(1) in the first memory die 200(1) do not connect to the data bit lines 236(2) in the second memory die. Note that the third data bit lines 236(3) in the third memory die 200(3) do not connect to the fourth data bit lines 236(4) in the fourth memory die 200(4). The control die 204 may control the data bit lines in a similar way as described with respect to an embodiment depicted in FIG. 10A. Note that an embodiment of FIG. 10A is not required to use the dummy bit lines 1036 to make connections to data bit lines. The word lines 232 may be operated as described in the description of FIG. 10A.

Figure 10C:
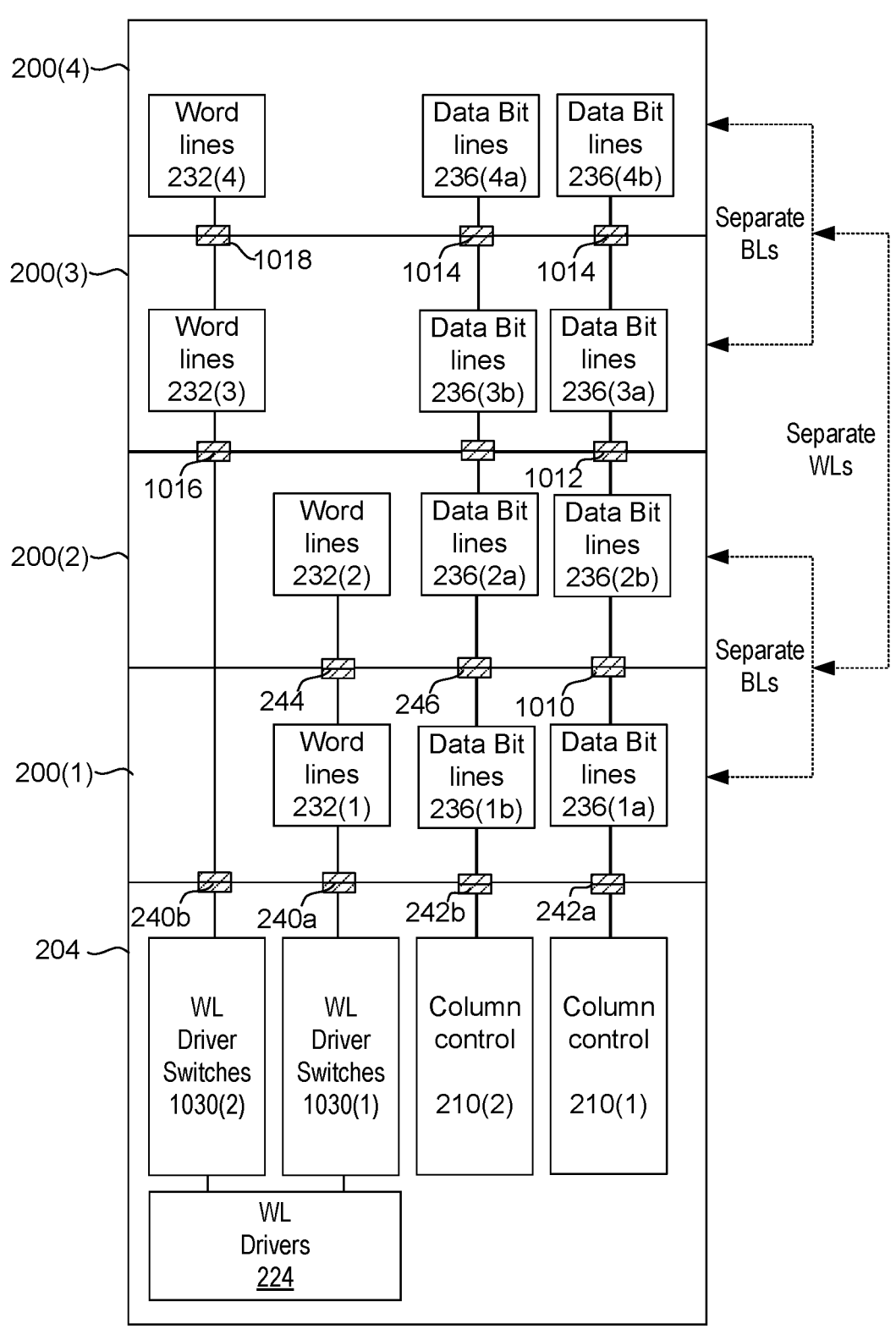

FIG. 10C depicts another embodiment of an integrated memory assembly 207 having a hybrid architecture. Each memory die 200 has two sets of bit lines, which may alternate with each other. During an embodiment of a memory operation one of the two sets of the bit lines is used in one memory die and one of the two sets of the bit lines is used in another memory die. Memory dies 200(1), 200(2) in FIG. 10C may have bit line connections similar to those shown and described with respect to an embodiment of FIGS. 6A-6B and/or 8B. Referring again to FIGS. 6A-6B, each of two adjacent dies 200 have two sets of bit lines over the block of memory cells. However, only one of the two sets of bit lines are used in each memory die at one time.

With reference now to FIG. 10C, column control circuitry 210(1) may be used to control bit lines 236(1a) in memory die 200(1) while column control circuitry 210(2) are used to control bit lines 236(2a) in memory die 200(2). Alternatively, column control circuitry 210(1) may be used to control bit lines 236(2b) in memory die 200(2) while column control circuitry 210(2) are used to control bit lines 236(1b) in memory die 200(1). As another example, column control circuitry 210(1) may be used to control bit lines 236(3a) in memory die 200(3) while column control circuitry 210(2) are used to control bit lines 236(4a) in memory die 200(4). Alternatively, column control circuitry 210(1) may be used to control bit lines 236(4b) in memory die 200(4) while column control circuitry 210(2) are used to control bit lines 236(3b) in memory die 200(3). In these examples a pair of memory dies are being operated with separate bit lines. The word lines 232 may be operated as described in the description of FIG. 10A.

In view of the foregoing, an embodiment includes an apparatus comprising a first semiconductor die, a second semiconductor die bonded to the first semiconductor die, and a third semiconductor die bonded to the first semiconductor die. The first semiconductor die comprises a first memory structure having first blocks of memory cells. Each first block comprising word lines, multiple drain side select lines, and NAND strings. The word lines of each first block connect to all NAND strings in the first block. Each drain side select line of each first block connects to select transistors on a group of the NAND strings that comprise a first sub-block. The first semiconductor die comprising first bit lines extending across the first memory structure. The first bit lines comprise a first set of bit lines that alternate with a second set of bit lines. The NAND strings of each first sub-block on the first semiconductor die connect to either the first set of bit lines or the second set of bit lines. The second semiconductor die comprises a second memory structure having second blocks of memory cells. Each second each block comprises word lines, multiple drain side select lines, and NAND strings. The word lines of each second block connect to all NAND strings in the second block. Each drain side select line of each second block connects to select transistors on a group of the NAND strings that comprise a second sub-block. The second semiconductor die comprises second bit lines extending across the second memory structure. Each NAND string of each second sub-block on the second semiconductor die connects to a bit line of the second bit lines. The third semiconductor die comprises control circuits that comprise first bit line control circuitry connected to the first bit lines and second bit line control circuitry connected to the second bit lines. The control circuits are configured to control either the first set or the second set of the first bit lines extending across the first memory structure while controlling an equal number of the second bit lines extending across the second memory structure to perform a memory operation in parallel in a first sub-block in the first semiconductor die and a second sub-block in the second semiconductor die.

In an embodiment, the first set of bit lines are data bit lines, with each data bit line connecting to a NAND string in each first sub-block on the first semiconductor die. The second set of bit lines are dummy bit lines. The dummy bit lines do not connect to any NAND string in the first semiconductor die.

In an embodiment, the apparatus further comprises electrical connections, with each electrical connection electrically connecting one of the dummy bit lines on the first semiconductor die to one of the second bit lines on the second semiconductor die.

In an embodiment, the control circuits are configured to control the first set of bit lines in the first semiconductor die with the first bit line control circuitry while controlling the second bit lines in the second semiconductor die with the second bit line control circuitry to perform the memory operation in parallel in the first sub-block in the first semiconductor die and the second sub-block in the second semiconductor die.

In an embodiment, the second bit lines comprise a third set of bit lines that alternate with a fourth set of bit lines. The NAND strings of each second sub-block on the second semiconductor die connect to either the third set of bit lines or the fourth set of bit lines.

In an embodiment, the apparatus further comprises a first set of electrical connections electrically connecting one of the first set of bit lines on the first semiconductor die to one of the third set of bit lines on the second semiconductor die. The apparatus further comprises a second set of electrical connections electrically connecting one of the second set of bit lines on the first semiconductor die to one of the fourth set of bit lines on the second semiconductor die.

In an embodiment, the control circuits are configured to control the first set of bit lines in the first semiconductor die with the first bit line control circuitry while controlling the fourth set of bit lines in the second semiconductor die with the second bit line control circuitry at a first point in time to perform the memory operation in parallel in the first sub-block in the first semiconductor die and the second sub-block in the second semiconductor die. The control circuits are configured to control the second set of bit lines in the first semiconductor die with the first bit line control circuitry while controlling the third set of bit lines in the second semiconductor die with the second bit line control circuitry at a second point in time to perform a memory operation in parallel in a third sub-block in the first semiconductor die and a fourth sub-block in the second semiconductor die.

In an embodiment, the first bit lines consist of n bit lines. Each first sub-block on the first semiconductor die consists of approximately n/2 NAND strings.

In an embodiment, the first memory structure comprises alternating conductive layers and insulating layers, wherein a plurality of the conductive layers serve as first word line layers. The second memory structure comprises alternating conductive layers and insulating layers, wherein a plurality of the conductive layers serve as second word line layers. The first word line layers are electrically connected to corresponding layers in the second word line layers.

In an embodiment, the first semiconductor die and the second semiconductor die are bonded together by bond pads. The first memory structure further comprises a bit line break region between two of the blocks. The bit line break region comprises vias that connect at least half of the first bit lines to the bond pads. The second semiconductor die comprises electrical pathways that connect the second bit lines to the bond pads.

One embodiment includes a non-volatile memory device comprising: a first semiconductor die, a second semiconductor die bonded to the first semiconductor die, the second semiconductor die, and a third semiconductor die bonded to the first semiconductor die. The first semiconductor die comprises a first memory structure having NAND strings. The first semiconductor die comprises a first plurality of bit lines extending across the first memory structure. The first plurality of bit lines comprise first data bit lines alternating with dummy bit lines. Each first data bit line connects to multiple NAND strings in the first memory structure. The dummy bit lines do not connect to any NAND string in the first semiconductor die. The second semiconductor die comprises a second memory structure having NAND strings. The second semiconductor die comprises a second plurality of bit lines extending across the second memory structure. The second plurality of bit lines comprise second data bit lines with each second data bit line connecting to multiple NAND strings in the second memory structure. The third semiconductor die comprises first bit line control circuitry configured to control memory operations in the first memory structure and second bit line control circuitry configured to control memory operations in the second memory structure. The non-volatile memory device comprises first electrical connections that connect the first bit line control circuitry to the first data bit lines in the first semiconductor die. The non-volatile memory device comprises second electrical connections that connect the second bit line control circuitry to the second data bit lines in the second semiconductor die. Each second electrical connection comprises a dummy bit line of the dummy bit lines on the first semiconductor die.

One embodiment includes an integrated memory assembly. The integrated memory assembly comprises a control semiconductor die having a first set of sense amplifiers and a second set of sense amplifiers. The integrated memory assembly comprises a first pair of memory semiconductor dies. A first memory semiconductor die of the first pair has a first set of data bit lines. A second memory semiconductor die of the first pair has a second set of data bit lines. The first set of data bit lines is connected to and controlled by the first set of sense amplifiers and the second set of data bit lines is connected to and controlled by the second set of sense amplifiers. The first pair of memory semiconductor dies are bonded together. The integrated memory assembly comprises a second pair of memory semiconductor dies. A third memory semiconductor die of the second pair has a third set of data bit lines. A fourth memory semiconductor die of the second pair has a fourth set of data bit lines. The third set of data bit lines is connected to and controlled by the first set of sense amplifiers and the fourth set of data bit lines is connected to and controlled by the second set of sense amplifiers. The second pair of memory semiconductor dies are bonded together. The first pair of memory semiconductor dies are bonded to the second pair of memory semiconductor dies. The second pair of memory semiconductor dies are bonded to the control semiconductor die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a first semiconductor die comprising:
   a first memory structure having first blocks of memory cells, wherein each first block comprises word lines, multiple drain side select lines, and NAND strings, wherein the word lines of each first block connect to all NAND strings in the first block, wherein each drain side select line of each first block connects to select transistors on a group of the NAND strings that comprise a first sub-block; and
   first bit lines extending across the first memory structure, wherein the first bit lines comprise a first set of bit lines that alternate with a second set of bit lines, wherein the NAND strings of each first sub-block on the first semiconductor die connect to either the first set of bit lines or the second set of bit lines;
a second semiconductor die bonded to the first semiconductor die, the second semiconductor die comprising:
   a second memory structure having second blocks of memory cells, wherein second each block comprises word lines, multiple drain side select lines, and NAND strings, wherein the word lines of each second block connect to all NAND strings in the second block, wherein each drain side select line of each second block connects to select transistors on a group of the NAND strings that comprise a second sub-block; and
   second bit lines extending across the second memory structure, wherein each NAND string of each second sub-block on the second semiconductor die connects to a bit line of the second bit lines; and
a third semiconductor die bonded to the first semiconductor die, the third semiconductor die comprising control circuits that comprise first bit line control circuitry connected to the first bit lines and second bit line control circuitry connected to the second bit lines, wherein the control circuits are configured to control either the first set or the second set of the first bit lines extending across the first memory structure while controlling an equal number of the second bit lines extending across the second memory structure to perform a memory operation in parallel in a first sub-block in the first semiconductor die and a second sub-block in the second semiconductor die.

2. The apparatus of claim 1, wherein:
the first set of bit lines are data bit lines, each data bit line connecting to a NAND string in each first sub-block on the first semiconductor die; and the second set of bit lines are dummy bit lines, wherein the dummy bit lines do not connect to any NAND string in the first semiconductor die.

3. The apparatus of claim 2, further comprising:
electrical connections, each electrical connection electrically connecting one of the dummy bit lines on the first semiconductor die to one of the second bit lines on the second semiconductor die.

4. The apparatus of claim 3, wherein the control circuits are configured to:
control the first set of bit lines in the first semiconductor die with the first bit line control circuitry while controlling the second bit lines in the second semiconductor die with the second bit line control circuitry to perform the memory operation in parallel in the first sub-block in the first semiconductor die and the second sub-block in the second semiconductor die.

5. The apparatus of claim 1, wherein:
the second bit lines comprise a third set of bit lines that alternate with a fourth set of bit lines; and
the NAND strings of each second sub-block on the second semiconductor die connect to either the third set of bit lines or the fourth set of bit lines.

6. The apparatus of claim 5, further comprising:
a first set of electrical connections electrically connecting one of the first set of bit lines on the first semiconductor die to one of the third set of bit lines on the second semiconductor die; and
a second set of electrical connections electrically connecting one of the second set of bit lines on the first semiconductor die to one of the fourth set of bit lines on the second semiconductor die.

7. The apparatus of claim 6, wherein the control circuits are configured to:
control the first set of bit lines in the first semiconductor die with the first bit line control circuitry while controlling the fourth set of bit lines in the second semiconductor die with the second bit line control circuitry at a first point in time to perform the memory operation in parallel in the first sub-block in the first semiconductor die and the second sub-block in the second semiconductor die; and
control the second set of bit lines in the first semiconductor die with the first bit line control circuitry while controlling the third set of bit lines in the second semiconductor die with the second bit line control circuitry at a second point in time to perform a memory operation in parallel in a third sub-block in the first semiconductor die and a fourth sub-block in the second semiconductor die.

8. The apparatus of claim 1, wherein:
the first bit lines consist of n bit lines; and
each first sub-block on the first semiconductor die consists of approximately n/2 NAND strings.

9. The apparatus of claim 1, wherein:
the first memory structure comprises alternating conductive layers and insulating layers, wherein a plurality of the conductive layers serve as first word line layers;
the second memory structure comprises alternating conductive layers and insulating layers, wherein a plurality of the conductive layers serve as second word line layers; and
the first word line layers are electrically connected to corresponding layers in the second word line layers.

10. The apparatus of claim 1, wherein:
the first semiconductor die and the second semiconductor die are bonded together by bond pads;

the first memory structure further comprises a bit line break region between two of the blocks;

the bit line break region comprises vias that connect at least half of the first bit lines to the bond pads; and the second semiconductor die comprises electrical pathways that connect the second bit lines to the bond pads.

11. A non-volatile memory device comprising:

a first semiconductor die comprising a first memory structure having NAND strings, wherein the first semiconductor die comprises a first plurality of bit lines extending across the first memory structure, the first plurality of bit lines comprise first data bit lines alternating with dummy bit lines, wherein each first data bit line connects to multiple NAND strings in the first memory structure, wherein the dummy bit lines do not connect to any NAND string in the first semiconductor die;

a second semiconductor die bonded to the first semiconductor die, the second semiconductor die comprising a second memory structure having NAND strings, wherein the second semiconductor die comprises a second plurality of bit lines extending across the second memory structure, the second plurality of bit lines comprise second data bit lines with each second data bit line connecting to multiple NAND strings in the second memory structure;

a third semiconductor die bonded to the first semiconductor die, the third semiconductor die comprising first bit line control circuitry configured to control memory operations in the first memory structure and second bit line control circuitry configured to control memory operations in the second memory structure;

first electrical connections that connect the first bit line control circuitry to the first data bit lines in the first semiconductor die; and second electrical connections that connect the second bit line control circuitry to the second data bit lines in the second semiconductor die, wherein each second electrical connection comprises a dummy bit line of the dummy bit lines on the first semiconductor die.

12. The non-volatile memory device of claim 11, wherein the control circuits are configured to:

control the first data bit lines in the first semiconductor die with the first bit line control circuitry while controlling the second data bit lines in the second semiconductor die with the second bit line control circuitry to perform a memory operation in parallel in the first memory structure and the second memory structure.

13. The non-volatile memory device of claim 11, wherein:

the first memory structure comprises blocks of memory cells;

the second memory structure comprises blocks of memory cells;

each block in the first and second memory structure comprises word lines and multiple drain side select lines, the word lines of a block connect to all NAND strings in the block, each drain side select line connects to select transistors on a group of the NAND strings that comprise a sub-block;

each first data bit line is connected to a NAND string in each sub-block in the first memory structure; and each second data bit line is connected to a NAND string in each sub-block in the second memory structure.

14. The non-volatile memory device of claim 11, wherein:

the first plurality of bit lines consist of n bit lines; and each sub-block on the first semiconductor die consists of approximately n/2 NAND strings.

15. The non-volatile memory device of claim 11, wherein:

the first memory structure comprises alternating conductive layers and insulating layers, wherein a plurality of the conductive layers serve as first word line layers;

the second memory structure comprises alternating conductive layers and insulating layers, wherein a plurality of the conductive layers serve as second word line layers; and the first word line layers are connected to corresponding layers in the second word line layers.

* * * * *